United States Patent
Sudo

(10) Patent No.: US 10,771,010 B2
(45) Date of Patent: Sep. 8, 2020

(54) CIRCUIT DEVICE, OSCILLATOR, ELECTRONIC APPARATUS, AND VEHICLE

(71) Applicant: Seiko Epson Corporation, Tokyo (JP)

(72) Inventor: Yasuhiro Sudo, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/367,334

(22) Filed: Mar. 28, 2019

(65) Prior Publication Data

US 2019/0305726 A1    Oct. 3, 2019

(30) Foreign Application Priority Data

Mar. 29, 2018 (JP) ................ 2018-064906

(51) Int. Cl.
*H03B 5/04* (2006.01)
*H03L 7/085* (2006.01)
*H03B 5/24* (2006.01)
*H03B 5/36* (2006.01)

(52) U.S. Cl.
CPC ............. *H03B 5/04* (2013.01); *H03B 5/24* (2013.01); *H03B 5/368* (2013.01); *H03L 7/085* (2013.01)

(58) Field of Classification Search
CPC ...................................... H03B 5/04
USPC ........................................... 331/18
See application file for complete search history.

(56) References Cited

U.S. PATENT DOCUMENTS 6,711,230 B1 * 3/2004 Nicholls ............ G04G 3/00
327/147
2017/0194907 A1   7/2017 Yonezawa

FOREIGN PATENT DOCUMENTS

JP          2017-123628 A    7/2017

* cited by examiner

*Primary Examiner* — Joseph Chang
(74) *Attorney, Agent, or Firm* — Harness, Dickey & Pierce, P.L.C.

(57) ABSTRACT

A circuit device includes a processing circuit and an oscillation signal generation circuit. The processing circuit performs Kalman filter processing for a result of phase comparison between an input signal based on an oscillation signal and a reference signal and performs loop filter processing for the result of phase comparison. The oscillation signal generation circuit generates the oscillation signal of an oscillation frequency set by frequency control data which is output data of the loop filter processing by using the frequency control data and a resonator. The processing circuit estimates a truth value for an observed value of the result of phase comparison by using the Kalman filter processing.

15 Claims, 14 Drawing Sheets

FIG. 3
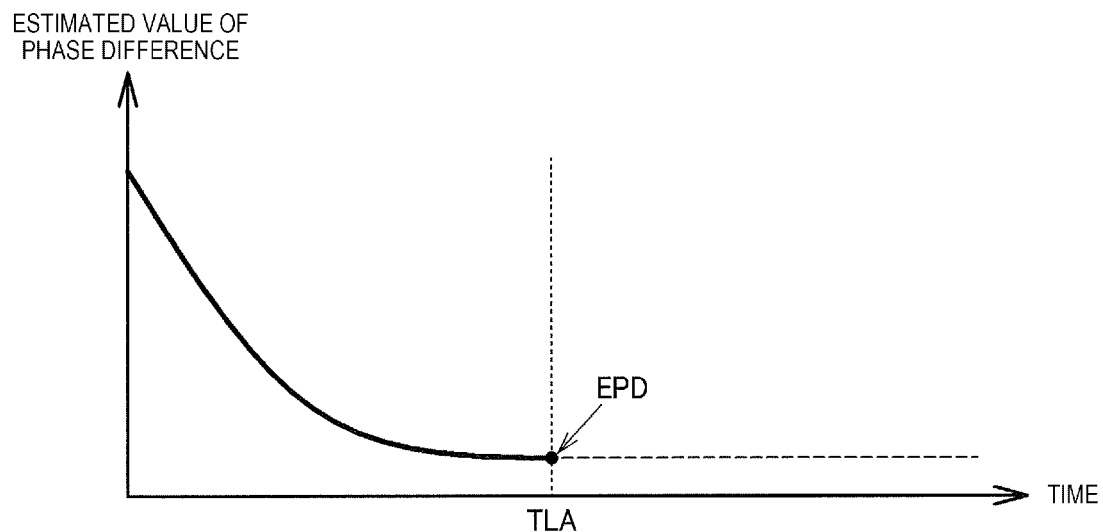
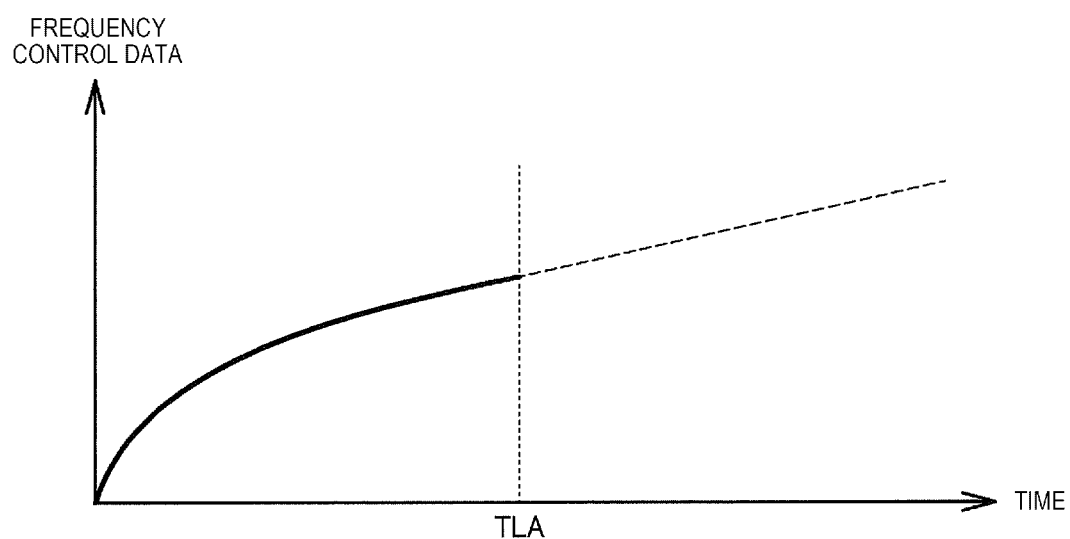
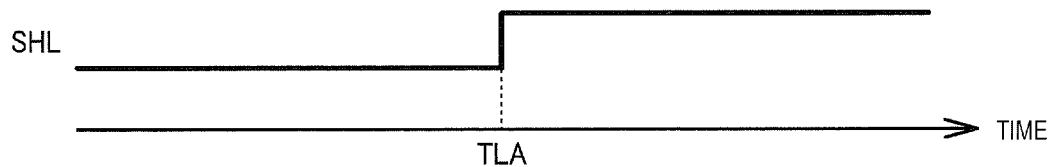

FIG. 5
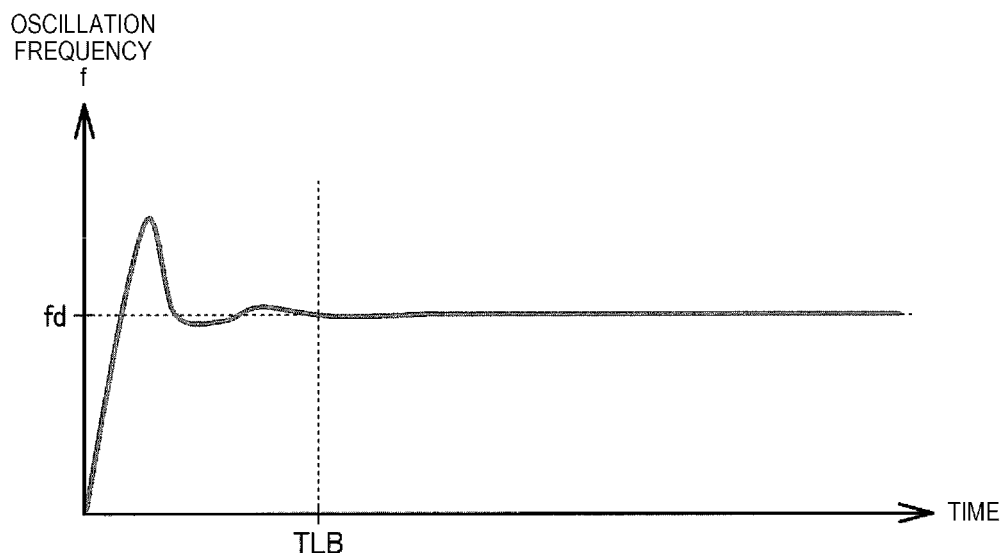
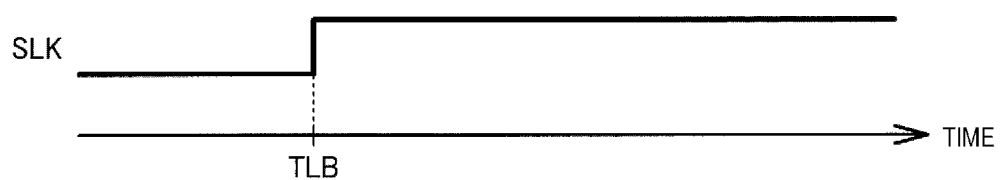
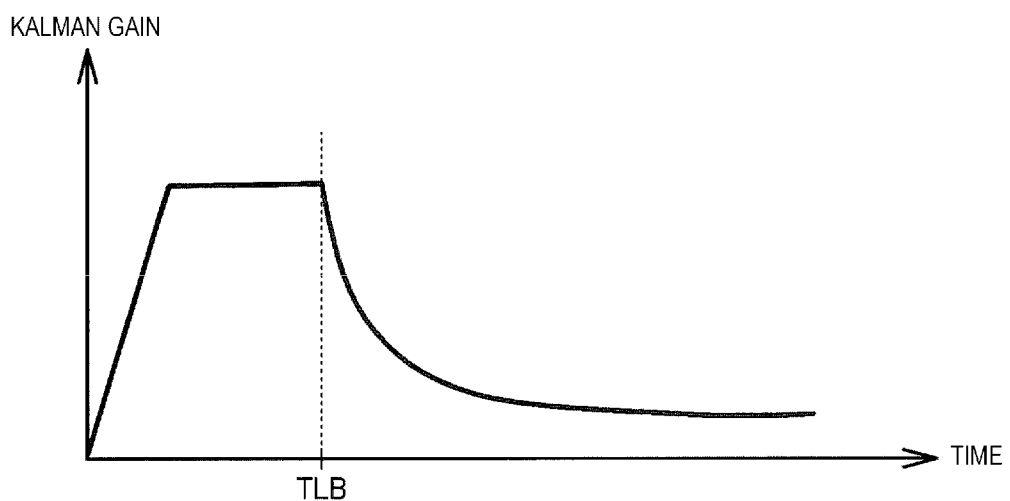

FIG. 6
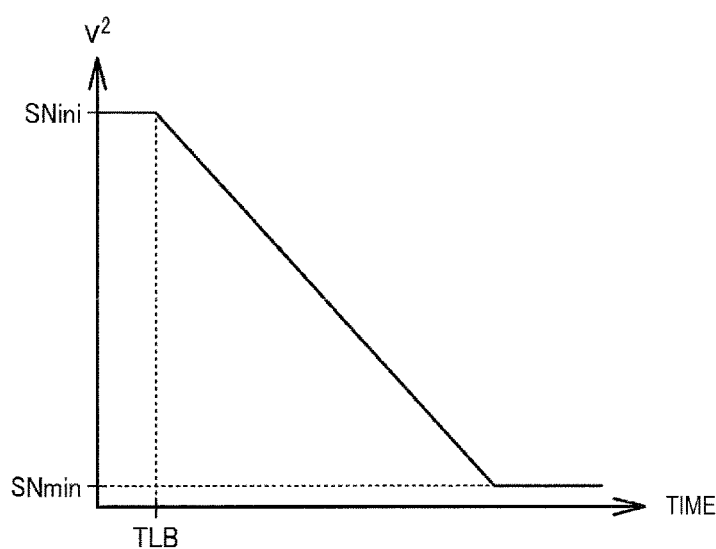
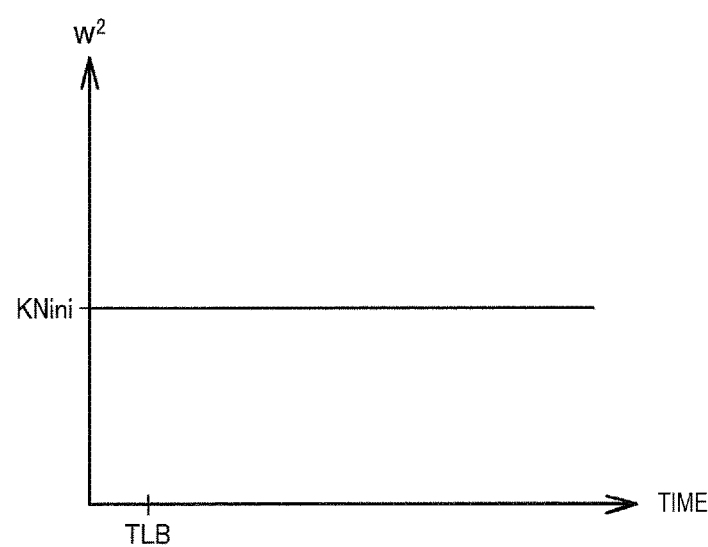
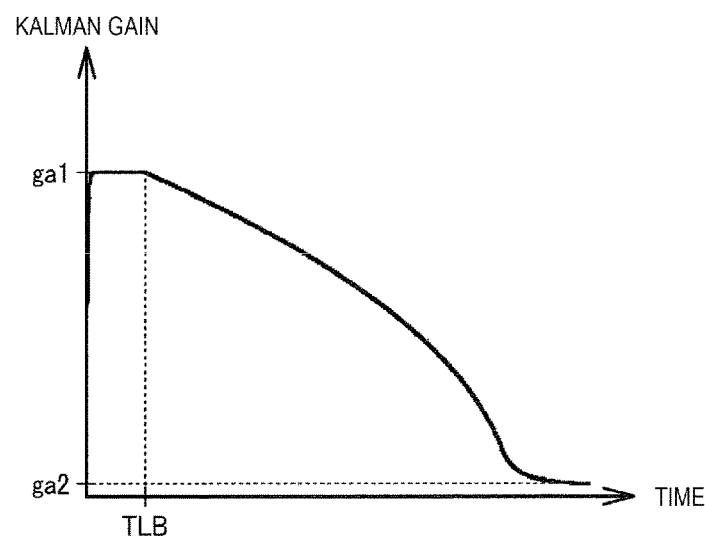

FIG. 7
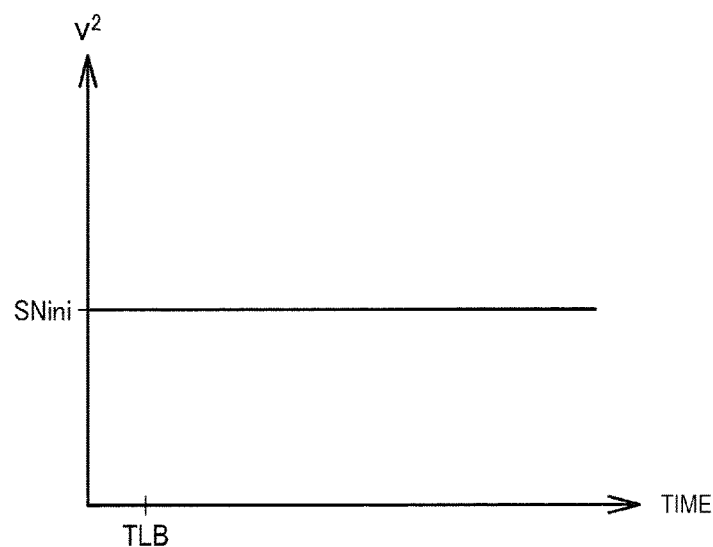
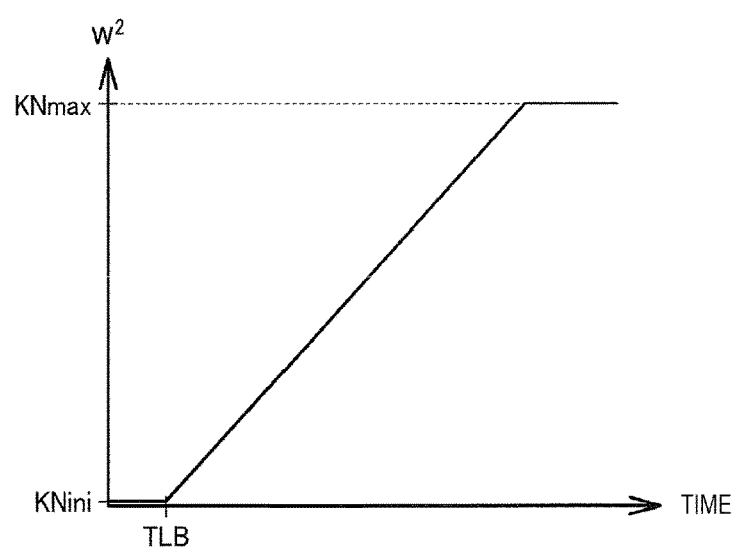
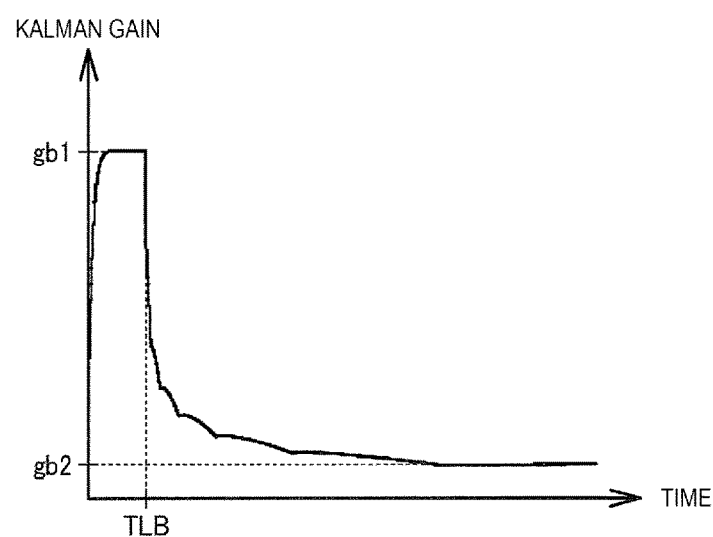

FIG. 8
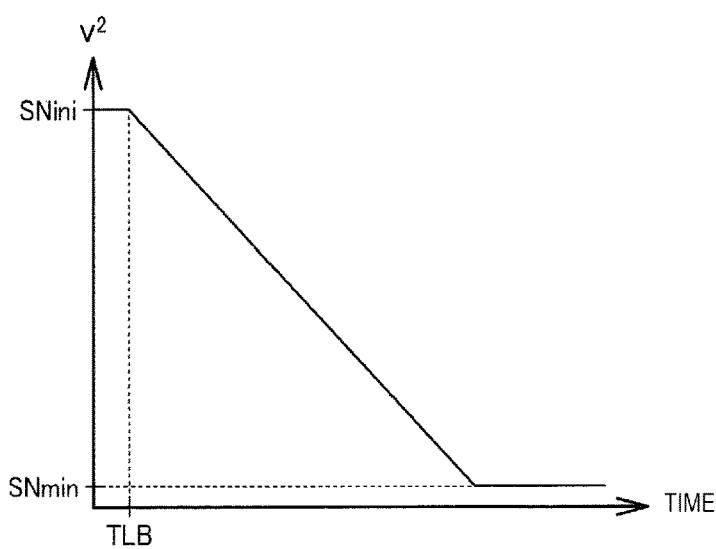
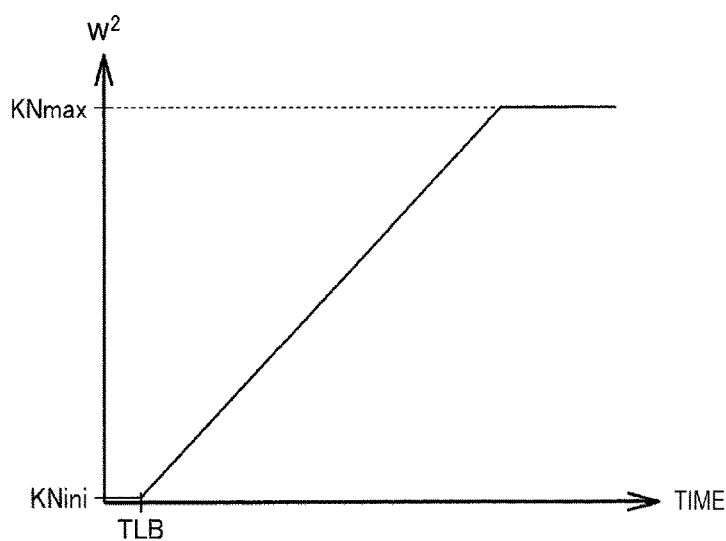
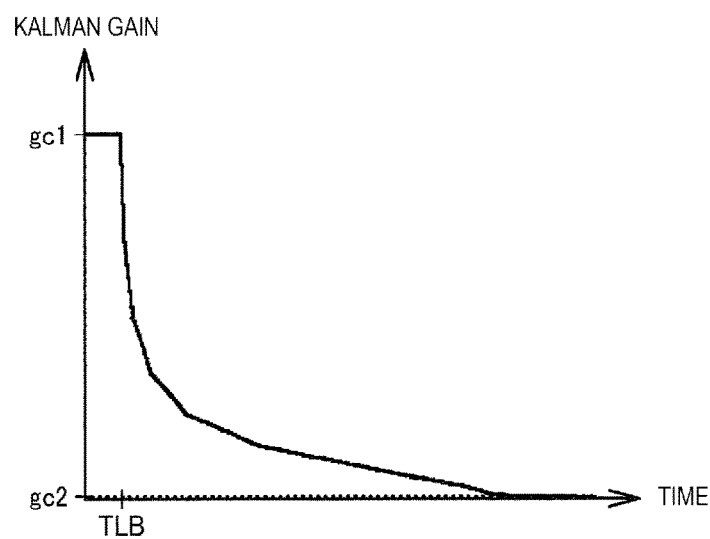

FIG. 12
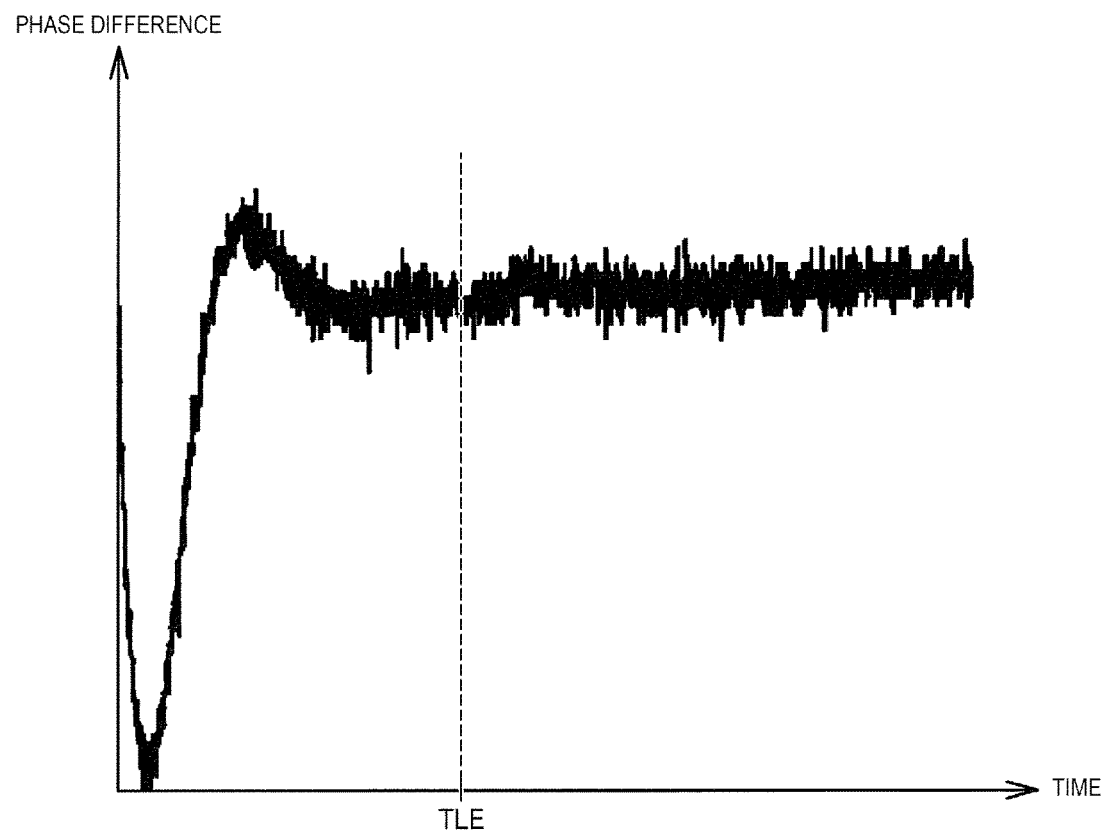
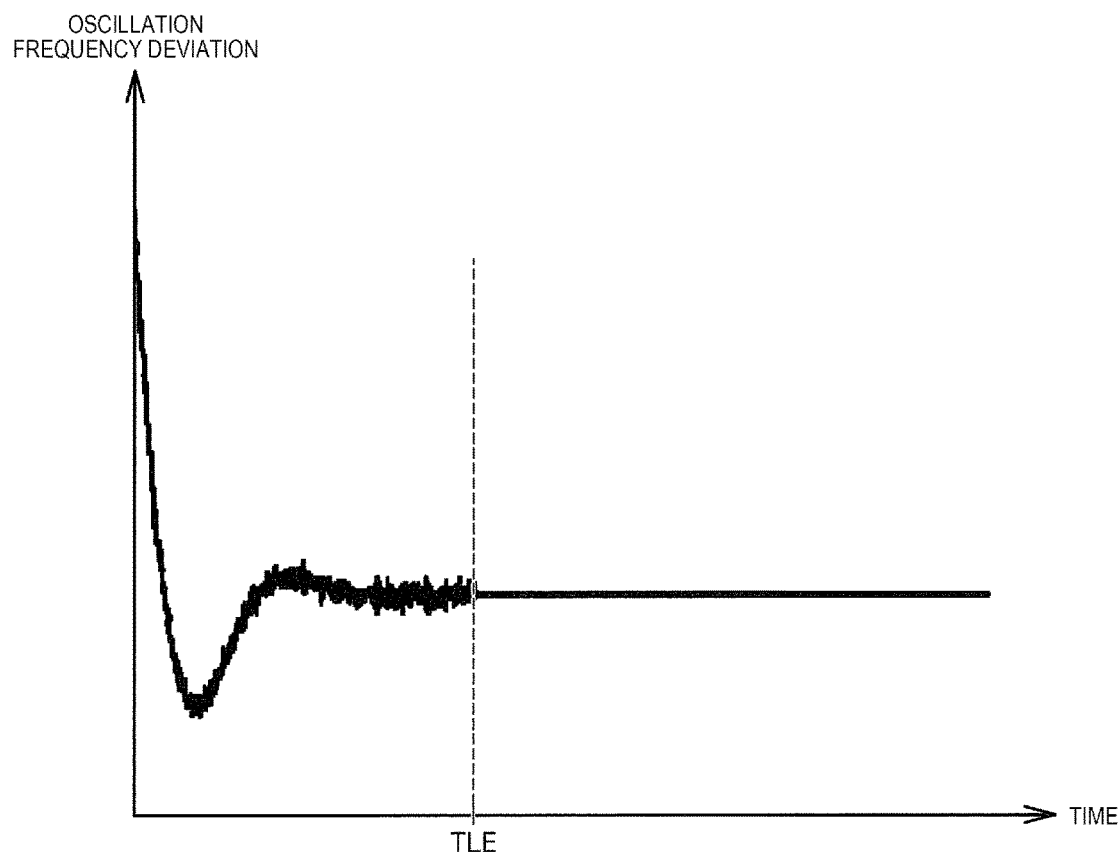

CIRCUIT DEVICE, OSCILLATOR, ELECTRONIC APPARATUS, AND VEHICLE

BACKGROUND

1. Technical Field

The present invention relates to a circuit device, an oscillator, an electronic apparatus, a vehicle, and the like.

2. Related Art

In the related art, an oscillator such as an oven controlled crys(X)tal oscillator (OCXO) or a temperature compensated crys(X)tal oscillator (TCXO) is known. For example, the OCXO is used as a reference signal source in a base station, a network router, a measurement apparatus, and the like.

The oscillator such as the OCXO or the TCXO requires a high frequency stability. However, there is a problem that a secular change which is called aging occurs in an oscillation frequency of the oscillator and thereby the oscillation frequency varies with time elapse. For example, in a case where a reference signal such as a GPS signal is not receivable and enters a so-called holdover state, the oscillation frequency varies due to the aging. Aging correction is provided as a method of suppressing the variation of the oscillation frequency. For example, a technique is disclosed in JP-A-2017-123628 as a technique of related art of the aging correction.

In JP-A-2017-123628, in a non-holdover state in which a reference signal is receivable, a loop filter of a PLL circuit outputs frequency control data to an oscillation signal generation circuit, the frequency control data is input to a Kalman filter, and the Kalman filter estimates a truth value of the frequency control data and a slope of a time change. When the reference signal is changed to the holdover state in which the reference signal is not receivable, the Kalman filter holds the estimated values of the truth value and the slope of the time change at the time of changing into the holdover state, and an aging correction unit generates the frequency control data subjected to the aging correction based on the estimated value and outputs the frequency control data to the oscillation signal generation circuit.

In a case where the above-described aging correction is performed, or in a case where a variation of an oscillation frequency due to the aging is desired to acquire as data, it is necessary to monitor the variation of the oscillation frequency. The variation of the oscillation frequency due to the aging is a long-term variation, and a slope of a time change is small. There is a problem that it is difficult to follow the long-term variation in a short time and to estimate a time change of a small value with a high accuracy.

SUMMARY

An aspect of the invention relates to a circuit device including a processing circuit that performs Kalman filter processing for a result of phase comparison between an input signal based on an oscillation signal and a reference signal and performs loop filter processing for the result of phase comparison, and an oscillation signal generation circuit that generates the oscillation signal of an oscillation frequency set by frequency control data which is output data of the loop filter processing by using the frequency control data and a resonator, in which the processing circuit estimates a truth value for an observed value of the result of phase comparison by using the Kalman filter processing.

In the aspect of the invention, the processing circuit may set a system noise variance value and an observed noise variance value of the Kalman filter processing, and perform the Kalman filter processing based on the set system noise variance value and the set observed noise variance value.

In the aspect of the invention, the circuit device may further include a storage unit that stores a first initial value which is an initial value of the system noise variance value. The processing circuit may perform first processing of changing the system noise variance value from the first initial value.

In the aspect of the invention, the first processing may be processing of monotonically decreasing the system noise variance value from the first initial value.

In the aspect of the invention, the circuit device may further include a storage unit that stores a second initial value which is an initial value of the observed noise variance value. The processing circuit may perform second processing of changing the observed noise variance value from the second initial value.

In the aspect of the invention, the second processing may be processing of monotonically increasing the observed noise variance value from the second initial value.

In the aspect of the invention, when it is determined that the oscillation signal is locked to the reference signal, the processing circuit may change a cutoff frequency for the loop filter processing from a first frequency to a second frequency lower than the first frequency.

In the aspect of the invention, the circuit device may further include a storage unit that stores a first initial value which is an initial value of the system noise variance value. When it is determined that the oscillation signal is locked to the reference signal, the processing circuit may change a cutoff frequency for the loop filter processing from a first frequency to a second frequency lower than the first frequency and perform first processing of changing the system noise variance value from the first initial value.

In the aspect of the invention, the first processing may be processing of monotonically increasing the system noise variance value from the first initial value.

In the aspect of the invention, the circuit device may further include a storage unit that stores a second initial value which is an initial value of the observed noise variance value. When it is determined that the oscillation signal is locked to the reference signal, the processing circuit may change a cutoff frequency for the loop filter processing from a first frequency to a second frequency lower than the first frequency and perform second processing of changing the observed noise variance value from the second initial value.

In the aspect of the invention, the second processing may be processing of monotonically decreasing the observed noise variance value from the second initial value.

In the aspect of the invention, in a case where a holdover due to disappearance or abnormality of the reference signal is detected, the processing circuit may hold the truth value at timing corresponding to detection timing of the holdover and generate the frequency control data which is subjected to aging correction by performing the loop filter processing based on the truth value.

In the aspect of the invention, in a convergence state of the Kalman filter processing, the processing circuit may perform low pass filter processing with a cutoff frequency that is set by the system noise variance value and the observed noise variance value.

Another aspect of the invention relates to an oscillator including the circuit device according to any one of the aspects described above and the resonator.

Still another aspect of the invention relates to an electronic apparatus including the circuit device according to any one of the aspects described above.

Still another aspect of the invention relates to a vehicle including the circuit device according to any one of the aspects described above.

BRIEF DESCRIPTION OF THE DRAWINGS

The invention will be described with reference to the accompanying drawings, wherein like numbers reference like elements.

FIG. 3 is a diagram illustrating an operation of the circuit device.

FIG. 5 is a diagram illustrating an operation of the Kalman filter.

FIG. 6 illustrates an example of simulation results in a case where only first processing is performed.

FIG. 7 illustrates an example of simulation results in a case where only second processing is performed.

FIG. 8 illustrates an example of simulation results in a case where both the first processing and the second processing are performed.

FIG. 12 illustrates an example of simulation results of a PLL circuit.

DESCRIPTION OF EXEMPLARY EMBODIMENTS

Hereinafter, preferred embodiments of the invention will be described in detail. The present embodiments described below do not unduly limit content of the invention described in the appended claims, and all of the configurations described in the present embodiments are not indispensable as means for solving the invention.

1. Circuit Device

Figure 1:
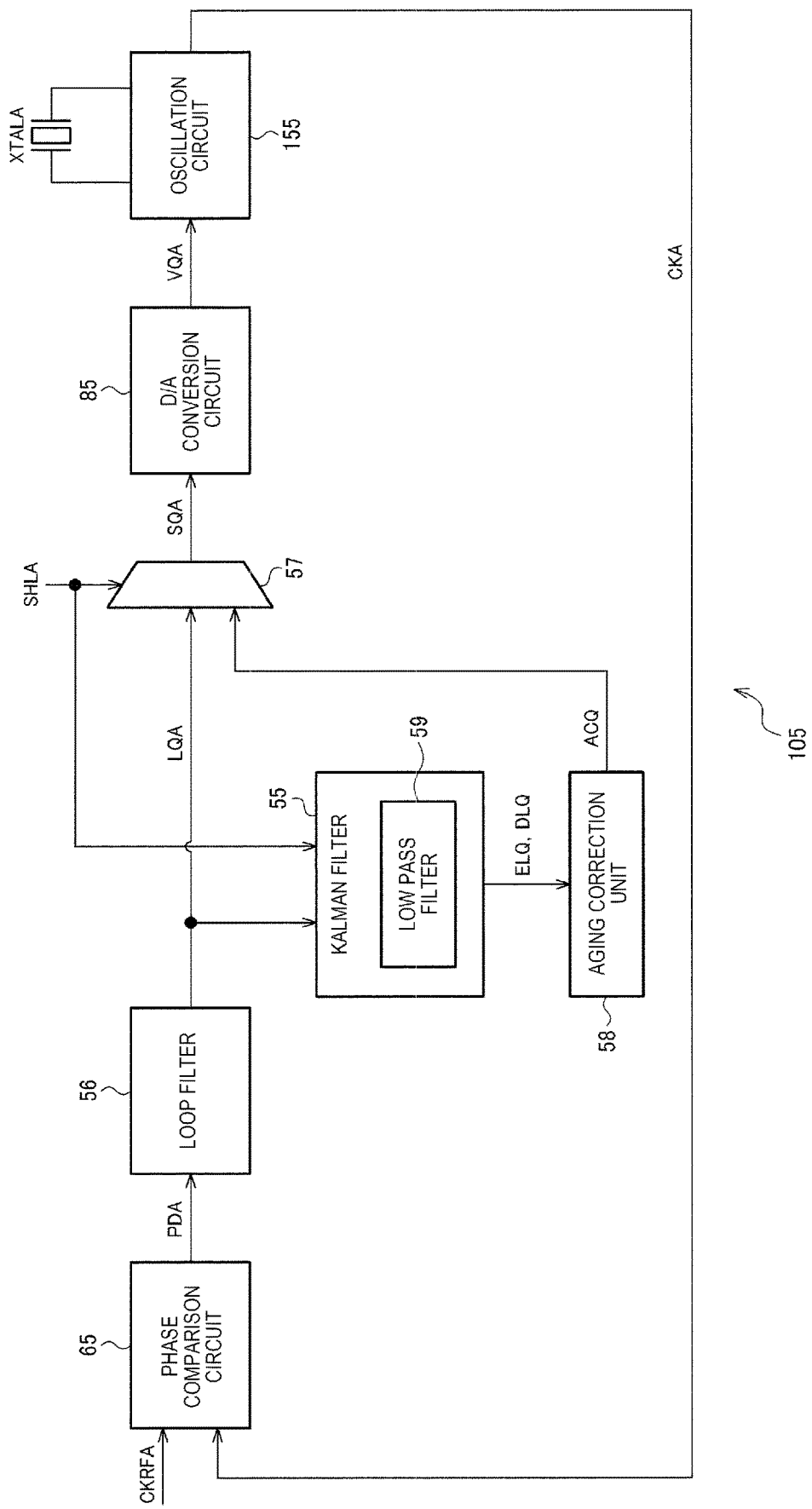
FIG. 1 illustrates a circuit device of a comparative example for the present embodiment.

FIG. 1 is a circuit device 105 according to a comparative example for the present embodiment. The circuit device 105 includes a phase comparison circuit 65, a loop filter 56, a Kalman filter 55, an aging correction unit 58, a selector 57, a D/A conversion circuit 85, and an oscillation circuit 155.

The phase comparison circuit 65 detects a phase difference between a reference signal CKRFA and a clock signal CKA which is output from the oscillation circuit 155, and outputs phase difference data PDA indicating the phase difference. The reference signal CKRFA is, for example, a time pulse signal or the like input from the GPS receiver. The loop filter 56 outputs frequency control data LQA for controlling an oscillation frequency based on the phase difference data PDA. The selector 57 selects the frequency control data LQA from the loop filter 56 or frequency control data ACQ from the aging correction unit 58, based on a holdover determination signal SHLA indicating whether or not a holdover state is established. In a case where a non-holdover state is established, the selector 57 selects the frequency control data LQA from the loop filter 56 and outputs the selected frequency control data as output data SQA. The D/A conversion circuit 85 performs a D/A conversion of the output data SQA and outputs a control voltage VQA corresponding to the output data SQA. The oscillation circuit 155 is a voltage controlled oscillator (VCO), oscillates a resonator XTALA at an oscillation frequency corresponding to the control voltage VQA, and outputs the clock signal CKA based on the oscillation signal.

The Kalman filter 55 estimates a truth value of the frequency control data LQA by using the frequency control data LQA from the loop filter 56 as an observed value. At this time, the previously estimated value $\hat{x}^-(k)$ at a time step k is obtained by following Equation (1). $\hat{x}(k-1)$ is a post-estimated value at a time step k−1, and D(k−1) is a correction value of the time step k−1. The post-estimated value $\hat{x}(k)$ corresponds to a truth value of the frequency control data LQA, and the correction value D(k) corresponds to a change in the frequency control data LQA per time step.

$$\hat{x}^-(k)=\hat{x}(k-1)+D(k-1) \quad (1)$$

The holdover determination signal SHLA is input to the Kalman filter 55. The Kalman filter 55 holds the post-estimated value $\hat{x}(k)$ at the time of shifting from the non-holdover state to the holdover state as an offset ELQ and holds the correction value D(k) as a correction value DLQ. The aging correction unit 58 adds the correction value DLQ to the offset ELQ at each time step and outputs the result as the frequency control data ACQ. The frequency control data ACQ becomes the aging-corrected frequency control data. In the holdover state, the selector 57 selects the frequency control data ACQ from the aging correction unit 58 and outputs the selected frequency control data as output data SQA. The D/A conversion circuit 85 performs a D/A conversion to change the output data SQA into the control voltage VQA, and the oscillation circuit 155 oscillates the resonator XTALA at an oscillation frequency corresponding to the control voltage VQA. By doing so, a time variation of an oscillation frequency due to aging of the resonator XTALA and the oscillation circuit 155 is corrected.

In Equation (1) described above, since the correction value D(k−1) is a value indicating a long-term time variation of the frequency control data LQA, the correction value D(k) is a greatly lower value than the post-estimated value $\hat{x}(k)$. Accordingly, two values having a relatively different magnitudes are handled during the Kalman filter processing, and there is a risk that a calculation accuracy is reduced. For example, since two values having a relatively different magnitudes are added to each other in Equation (1), there is a risk that information of a lower level digit of the correction value D(k) is lost in the calculation accuracy of the Kalman filter processing. As such, in a case where estimation is made by the Kalman filter 55 in the latter stage of the loop filter 56, there is a risk that the estimation accuracy is reduced.

The Kalman filter 55 includes a low pass filter 59 used for calculation of the correction value D(k). For example, the low pass filter 59 performs low pass filter processing for the correction value D(k) estimated by the Kalman filter 55. By using the low pass filter 59, a long-term time variation of the frequency control data LQA can be accurately calculated. However, as the accuracy of the correction value D(k) increases, a low pass filter with a low cutoff frequency is required, and the time from start of estimation to convergence of estimation is prolonged.

As described above, there is a problem that it is difficult to simultaneously achieve convergence in a short time and highly accurate estimation in a case where the long-term time variation of the oscillation frequency due to aging is monitored.

Figure 2:
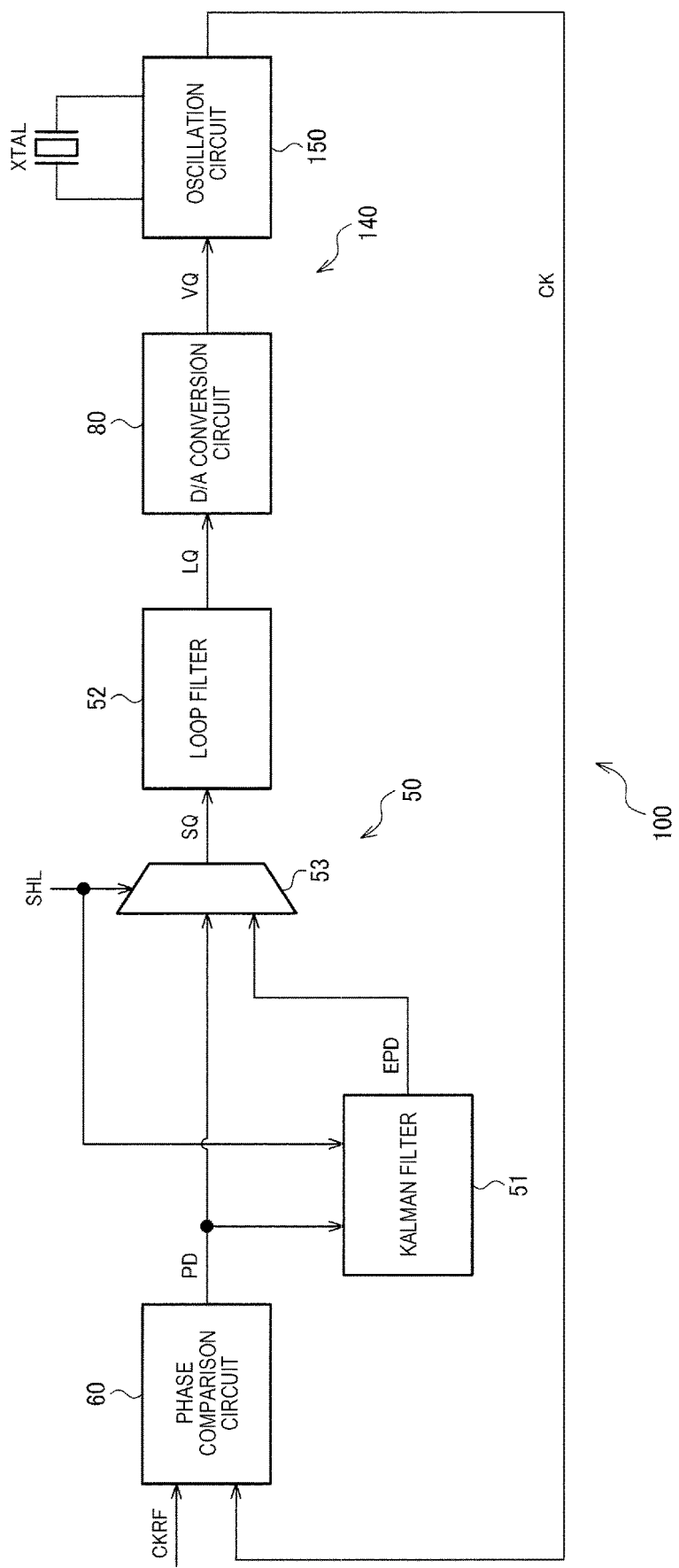
FIG. 2 illustrates a configuration example of the circuit device according to the present embodiment.

FIG. 2 illustrates a configuration example of the circuit device 100 according to the present embodiment. The circuit device 100 includes a phase comparison circuit 60, a processing circuit 50, and an oscillation signal generation circuit 140.

The phase comparison circuit 60 compares a phase between the reference signal CKRF and a clock signal CK from the oscillation circuit 150 and outputs phase difference data PD which is a phase comparison result. The phase comparison circuit 60 includes, for example, a counter, and the counter counts one cycle of the reference signal CKRF according to the clock signal CK. Then, the phase comparison circuit 60 outputs a difference between the counted value and a frequency setting value as phase difference data PD. The frequency setting value is a setting value for setting an oscillation frequency and is set by, for example, register setting or the like. Alternatively, the phase comparison circuit 60 is a time digital conversion circuit that measures a time difference between an edge of the reference signal CKRF and an edge of the clock signal CK. In this case, the phase comparison circuit 60 outputs the time difference data indicating the measured time difference as the phase difference data PD.

The reference signal CKRF is, for example, a time pulse signal input from a GPS receiver, a reference clock signal supplied from a network, or the like. Alternatively, the reference signal CKRF may be a clock signal supplied from an oscillator or an oscillation circuit provided at a front stage of the configuration of FIG. 2. The reference signal CKRF may be a signal generated in the circuit device 100 or may be a signal supplied from the outside of the circuit device 100.

In FIG. 2, the clock signal CK is input to the phase comparison circuit 60 as an input signal, but the invention is not limited to this, and the input signal may be a signal based on the oscillation signal. For example, the circuit device 100 may include a frequency dividing circuit (not illustrated), the frequency dividing circuit may divide a frequency of the clock signal CK, and the frequency-divided clock signal may be input to the phase comparison circuit 60 as an input signal.

The processing circuit 50 performs various types of digital signal processing based on the phase difference data PD and outputs frequency control data LQ as a processing result. The processing circuit 50 includes a Kalman filter 51, a selector 53, and a loop filter 52. For example, the processing circuit 50 is a digital signal processor (DSP). In this case, the DSP performs processing of the Kalman filter 51, the selector 53, and the loop filter 52 in a time sharing manner. Alternatively, the Kalman filter 51, the selector 53, and the loop filter 52 may be configured with separate logic circuits.

The Kalman filter 51 performs Kalman filter processing using the phase difference data PD as an observed value and estimates a truth value of the phase difference data PD. For example, it is assumed that a holdover determination signal SHL is in a low level when being in the non-holdover state and the holdover determination signal SHL is in a high level when being in the holdover state. The Kalman filter 51 estimates a truth value while the holdover determination signal SHL is in the low level, holds the truth value when the holdover determination signal SHL is changed from a low level to a high level, and outputs the held truth value as estimated phase difference data EPD. The Kalman filter processing will be described in detail below. The low level is a first logic level in a broad sense and the high level is a second logic level in a broad sense.

The selector 53 selects the phase difference data PD to output as output data SQ when the holdover determination signal SHL is at a low level and selects the estimated phase difference data EPD to output as the output data SQ when the holdover determination signal SHL is at a high level. In a case where the truth value of the phase difference data PD is estimated without performing the aging correction. The phase difference data PD may be directly input to the loop filter 52 without passing through the selector 53. In this case, the Kalman filter 51 may output the estimated value to the outside of the circuit device 100, for example, through an interface circuit (not illustrated).

The loop filter 52 performs loop filter processing for the output data SQ. The loop filter 52 performs the loop filter processing of the output data SQ and outputs the processing result as frequency control data LQ. The loop filter processing is low pass filter processing including integration processing.

The oscillation signal generation circuit 140 generates an oscillation signal of an oscillation frequency set by the frequency control data LQ by using the frequency control data LQ and the resonator XTAL. The oscillation signal generation circuit 140 outputs the clock signal CK based on the oscillation signal. For example, the oscillation signal generation circuit 140 includes a buffer circuit that buffers the oscillation signal, and an output signal of the buffer circuit is output as the clock signal CK. The oscillation signal generation circuit 140 includes a D/A conversion circuit 80 and an oscillation circuit 150.

The D/A conversion circuit 80 performs a D/A conversion of the frequency control data LQ and outputs a control voltage VQ corresponding to the frequency control data LQ. Various configurations such as a resistor string type, a resistance ladder type, a capacitance array type or the like can be adopted as a configuration of the D/A conversion circuit 80.

The oscillation circuit 150 generates an oscillation signal by using the control voltage VQ and the resonator XTAL. The oscillation circuit 150 is connected to the resonator XTAL and generates an oscillation signal by oscillating the resonator XTAL at an oscillation frequency controlled by the control voltage VQ. For example, the oscillation circuit 150 is a VCO. The VCO includes a drive circuit that drives the resonator XTAL and a variable capacitance capacitor. The drive circuit includes a first node connected to one terminal of the resonator XTAL and a second node connected to the other terminal of the resonator XTAL. One terminal of the variable capacitance capacitor is connected to the first node or the second node, and as a capacitance value of the variable capacitance capacitor is controlled by the control voltage VQ, the oscillation frequency is controlled.

A configuration of the oscillation signal generation circuit 140 is not limited to the configuration of FIG. 2. For example, the oscillation signal generation circuit 140 may include an oscillation circuit and a variable capacitance circuit connected to the oscillation circuit. The variable capacitance circuit includes a capacitor array and a switch array in which each switch element is turned on or off based on the frequency control data LQ. By turning on or off each switch element, the number of capacitors of the capacitor array connected to one terminal of the resonator XTAL changes. Thereby, the capacitance value of the variable capacitance circuit is controlled and the oscillation frequency is controlled. Alternatively, the oscillation signal generation circuit 140 may be realized by a direct digital synthesizer method. In this case, as a digital arithmetic processing based on the frequency control data LQ is performed for the oscillation signal of the resonator XTAL, a transmission signal of the oscillation frequency corresponding to the frequency control data LQ is generated.

FIG. 3 is a diagram illustrating an operation of the circuit device 100. In FIG. 3, the non-holdover state is continued till time TLA, and the holdover state starts from the time TLA. The holdover state is a state in which the reference signal CKRF disappears or becomes abnormal. A signal indicating whether or not the holdover state is established is input from, for example, the outside of the circuit device 100.

First, an operation in the period prior to the time TLA will be described. When the holdover determination signal SHL is at a low level, the selector 53 of FIG. 2 selects the phase difference data PD from the phase comparison circuit 60, and thereby, the phase comparison circuit 60, the loop filter 52, and the oscillation signal generation circuit 140 configure a PLL circuit. The PLL circuit performs a feedback control such that a phase of the clock signal CK is locked to a phase of the reference signal CKRF. Hereinafter, the "PLL circuit" means the configuration of FIG. 2 in the non-holdover state.

FIG. 3 schematically illustrates a time variation due to aging. If the same frequency control data LQ is continuously input to the oscillation signal generation circuit 140, the oscillation frequency is changed by the aging. That is, the frequency control data LQ for realizing the same oscillation frequency changes. Since the PLL circuit performs the feedback control such that the oscillation frequency is constant, the frequency control data LQ changes due to the aging. Since the frequency control data LQ is obtained by integrating the phase difference data PD, a time average of the phase difference data PD changes corresponding to a time differentiation of the frequency control data LQ. However, since the phase difference data PD is output at each phase comparison timing, the phase difference data is actually a value deviating from the time average.

A time change of the frequency control data LQ due to the aging can be regarded approximately as a primary change. When the frequency control data LQ makes a primary change with respect to time, a time average of the phase difference data PD corresponds to a slope of the time change of the frequency control data LQ. Since the Kalman filter 51 estimates a truth value of the phase difference data PD, the truth value is a value corresponding to the slope of the time change of the frequency control data LQ.

Next, an operation in the period posterior to the time TLA will be described. When the state is shifted to the holdover state and the holdover determination signal SHL changes from a low level to a high level, the Kalman filter 51 holds an estimated value as the estimated phase difference data EPD. The estimated value is an estimated truth value. The estimated phase difference data EPD corresponds to the slope of the frequency control data LQ at the time TLA.

When the holdover determination signal SHL is at a high level, the selector 53 selects the estimated phase difference data EPD, and thereby, the loop filter 52 integrates the estimated phase difference data EPD. Since the estimated phase difference data EPD corresponds to the slope of the time change of the frequency control data LQ due to the aging, the estimated value of the frequency control data LQ is obtained by integrating the slope. The estimated value is the frequency control data LQ obtained by correcting the time change due to the aging. As the oscillation signal generation circuit 140 oscillates based on the frequency control data LQ, aging correction of the oscillation frequency is realized.

According to the above-described embodiment, the processing circuit 50 performs Kalman filter processing for the phase comparison result between an input signal based on the oscillation signal and the reference signal CKRF, and loop filter processing for the phase comparison result. The oscillation signal generation circuit 140 generates the oscillation signal of the oscillation frequency set by the frequency control data LQ by using the frequency control data LQ which is output data of the loop filter processing and the resonator XTAL. Then, the processing circuit 50 estimates the truth value for the observed value of the phase comparison result through the Kalman filter processing.

As described above, the present embodiment includes the Kalman filter 51 at a prior stage of the loop filter 52, and the Kalman filter 51 estimates the truth value of the phase difference data PD by using the phase difference data PD which is the phase comparison result as the observed value. As described above, the truth value of the phase difference data PD corresponds to the slope of the time change of the frequency control data LQ due to the aging, and the Kalman filter 51 estimates the truth value of the phase difference data PD. In the comparative example of FIG. 1, the truth value of the frequency control data and the correction value which is a smaller than the truth value are estimated, and thereby, there is a risk that an estimation accuracy is reduced. In this respect, according to the present embodiment, since the Kalman filter 51 estimates the truth value of the phase difference data PD, it is unnecessary to handle two values having relatively different magnitudes, and the estimation accuracy of the truth value can be improved.

In addition, in the comparative example of FIG. 1, since the slope of the time change is obtained as a correction value for the truth value of the frequency control data, low pass filter processing for the correction value is performed. Accordingly, the low pass filter processing is one of reasons that convergence time of the estimation is prolonged. In this respect, according to the present embodiment, the Kalman filter 51 estimates the truth value of the phase difference data PD corresponding to the slope of the time change of the frequency control data LQ. As will be described below, the Kalman filter 51 in a convergence state functions as a low pass filter, and thus, low pass filter processing such as the low pass filter processing in the comparative example is not required. In addition, as will be described below, it is possible to adaptively change a cutoff frequency of the Kalman filter functioning as a low pass filter, and thereby, it is possible to further reduce the estimated convergence time.

As described above, according to the present embodiment, by providing the Kalman filter 51 in the prior stage of the loop filter 52, it is possible to achieve both convergence in a short time and highly accurate estimation.

In the present embodiment, the processing circuit 50 performs processing of estimating the truth value for the observed value of the phase comparison result through the Kalman filter processing during the period before the holdover due to disappearance or abnormality of the reference signal CKRF is detected. That is, as described with reference to FIG. 3, during the period prior to the time TLA, the Kalman filter 51 performs Kalman filter processing in which the phase difference data PD is used as the observed value. In a case where the holdover is detected, the processing circuit 50 holds the truth value at the timing corresponding to the holdover detection timing and performs the loop filter processing based on the truth value, and thereby the aging-corrected frequency control data LQ is generated. That is, as described with reference to FIG. 3, the Kalman filter 51 holds the truth value when the holdover determination signal SHL changes from the low level to the high level as the estimated phase difference data EPD. The loop filter 52 performs the loop filter processing of the estimated phase difference data EPD, thereby, outputting the aging-corrected frequency control data LQ.

According to the present embodiment, when the holdover state due to disappearance or abnormality of the reference signal CKRF is established, the frequency control data LQ is generated based on not only the phase difference data PD from the phase comparison circuit 60 but also the estimated phase difference data EPD from the Kalman filter 51. Thereby, the oscillation circuit 150 can perform self-oscillation in the holdover state. As the Kalman filter 51 performs the loop filter processing based on the truth value of the estimated phase difference data PD, that is, the estimated phase difference data EPD in the non-holdover state, aging correction in the holdover state can be realized.

2. Kalman Filter

Figure 4:
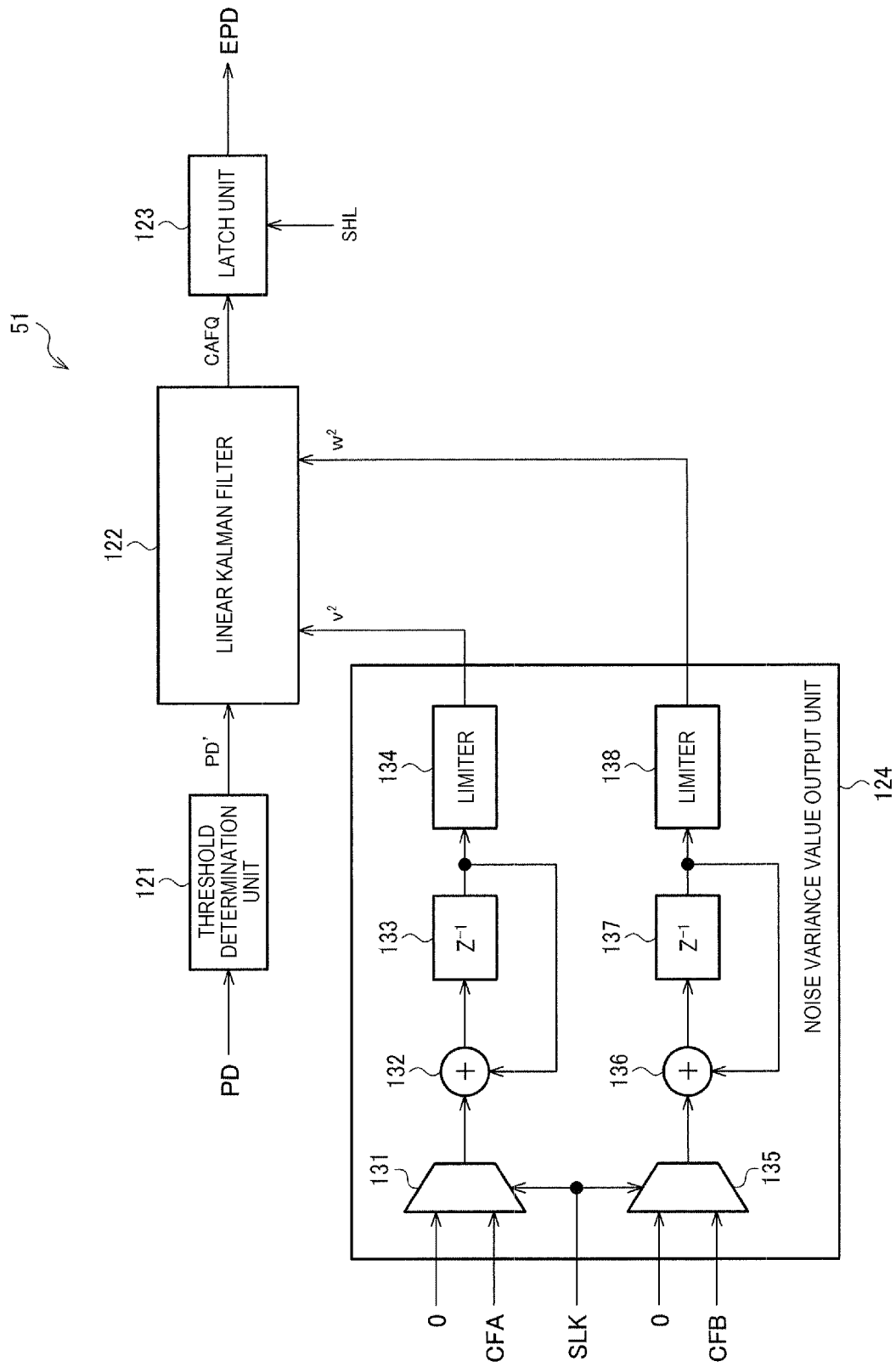
FIG. 4 illustrates a detailed configuration example of a Kalman filter.

FIG. 4 is a detailed configuration example of the Kalman filter 51. The Kalman filter 51 includes a threshold determination unit 121, a linear Kalman filter 122, a latch unit 123, and a noise variance value output unit 124.

The threshold determination unit 121 performs a threshold determination for the phase difference data PD from the phase comparison circuit 60. In a case where the phase difference data PD is smaller than or equal to a threshold value, the threshold determination unit 121 outputs the phase difference data PD as output data PD'. In a case where the phase difference data PD exceeds the threshold value, the phase difference data PD is limited to the same value as the threshold value. The noise variance value output unit 124 sets a system noise variance value v2 and an observed noise variance value w2. The linear Kalman filter 122 performs Kalman filter processing in which the output data PD' of the threshold determination unit 121 is used as an observed value, based on the set system noise variance value v2 and the observed noise variance value w2. The linear Kalman filter 122 outputs the estimated value as an output data CAFQ. The latch unit 123 holds the output data CAFQ when the holdover determination signal SHL is shifted from a low level to a high level and outputs the held output data CAFQ as the estimated phase difference data EPD.

According to the present embodiment, it is possible to control a Kalman gain of the Kalman filter processing by setting the system noise variance value v2 and the observed noise variance value w2 of the Kalman filter processing. Thereby, characteristics of the Kalman filter processing can be controlled. That is, when the Kalman gain is high, the observed value is easily reflected in the estimated value, and thus, the convergence time of the estimated value can be reduced by increasing the Kalman gain. Meanwhile, in a case where the Kalman gain is low, the estimated value is hardly changed, but since the Kalman filter has the same characteristic as the low pass filter, a highly accurate estimated value can be obtained by reducing the Kalman gain.

Hereinafter, detailed operations of the linear Kalman filter 122 and the noise variance value output unit 124 will be described.

The linear Kalman filter 122 performs the Kalman filter processing according to following Equation (2) to Equation (6). Equation (2) and Equation (3) are equations of time updating, and Equation (4) to Equation (6) are equations of observation updating.

$$\hat{x}^-(k) = \hat{x}(k-1) \quad (2)$$

$$P^-(k) = P(k-1) + v^2(k) \quad (3)$$

$$g(k) = \frac{P^-(k)}{P^-(k) + w^2(k)} \quad (4)$$

$$\hat{x}(k) = \hat{x}^-(k) + g(k) \times (y(k) - \hat{x}^-(k)) \quad (5)$$

$$P(k) = (1 - g(k)) \times P^-(k) \quad (6)$$

In Equation (2) to Equation (6) described above, $\hat{x}(k)$ is a post-estimated value of the time step k and $\hat{x}^-(k)$ is a previously estimated value of the time step k. $P(k)$ is a post-covariance of the time step k, and $P^-(k)$ is pre-covariance. $g(k)$ is the Kalman gain of the time step k. $y(k)$ is the observed value of the time step k. $v2(k)$ is the system noise variance value of time step k, and $w2(k)$ is the observed noise variance value of the time step k. "^" in $\hat{x}$ and the like is described as a superscript of x for the sake of convenience. In FIG. 4, the observed value $y(k)$ is the output data PD' of the threshold determination unit 121. The post-estimated value $\hat{x}(k)$ is the output data CAFQ of the linear Kalman filter 122.

In the convergence state of the Kalman filter processing of Equation (2) to Equation (6) described above, a frequency characteristic of the Kalman filter processing includes a low pass filter characteristic, and Equation (7) is approximately established. The convergence state is a state in which variations of the Kalman gain and the estimated value are reduced as the estimated value follows the observed value.

$$g \cong \frac{v}{w} \cong \frac{2\pi fc}{fs} \quad (7)$$

In the Equation (7) described above, g is the Kalman gain in the convergence state, v is a square root of the system noise variance value, and w is a square root of the observed noise variance value. fc is a cutoff frequency of the low pass filter characteristic of the linear Kalman filter 122 in the convergence state. fs is an operation frequency, that is, a sampling frequency of the linear Kalman filter 122.

According to the Equation (7) described above, it is understood that the Kalman gain g in the convergence state can be controlled by controlling the system noise variance value v2 and the observed noise variance value w2. In addition, since the cutoff frequency fc of the low pass filter characteristic in the convergence state is determined by the Kalman gain g, it is understood that the cutoff frequency fc can be controlled by controlling the Kalman gain g. That is, in the convergence state of the Kalman filter processing, the linear Kalman filter 122 operates as a low pass filter having the cutoff frequency fc set by the system noise variance value v2 and the observed noise variance value w2.

According to the present embodiment, in the convergence state of the Kalman filter processing, the processing circuit 50 performs the low pass filter processing with the cutoff frequency fc set by the system noise variance value v2 and the observed noise variance value w2. As such, it is possible to control the cutoff frequency fc of the low pass filter characteristic in the convergence state of the Kalman filter processing by setting the system noise variance value v2 and the observed noise variance value w2 of the Kalman filter processing.

Figure 13:
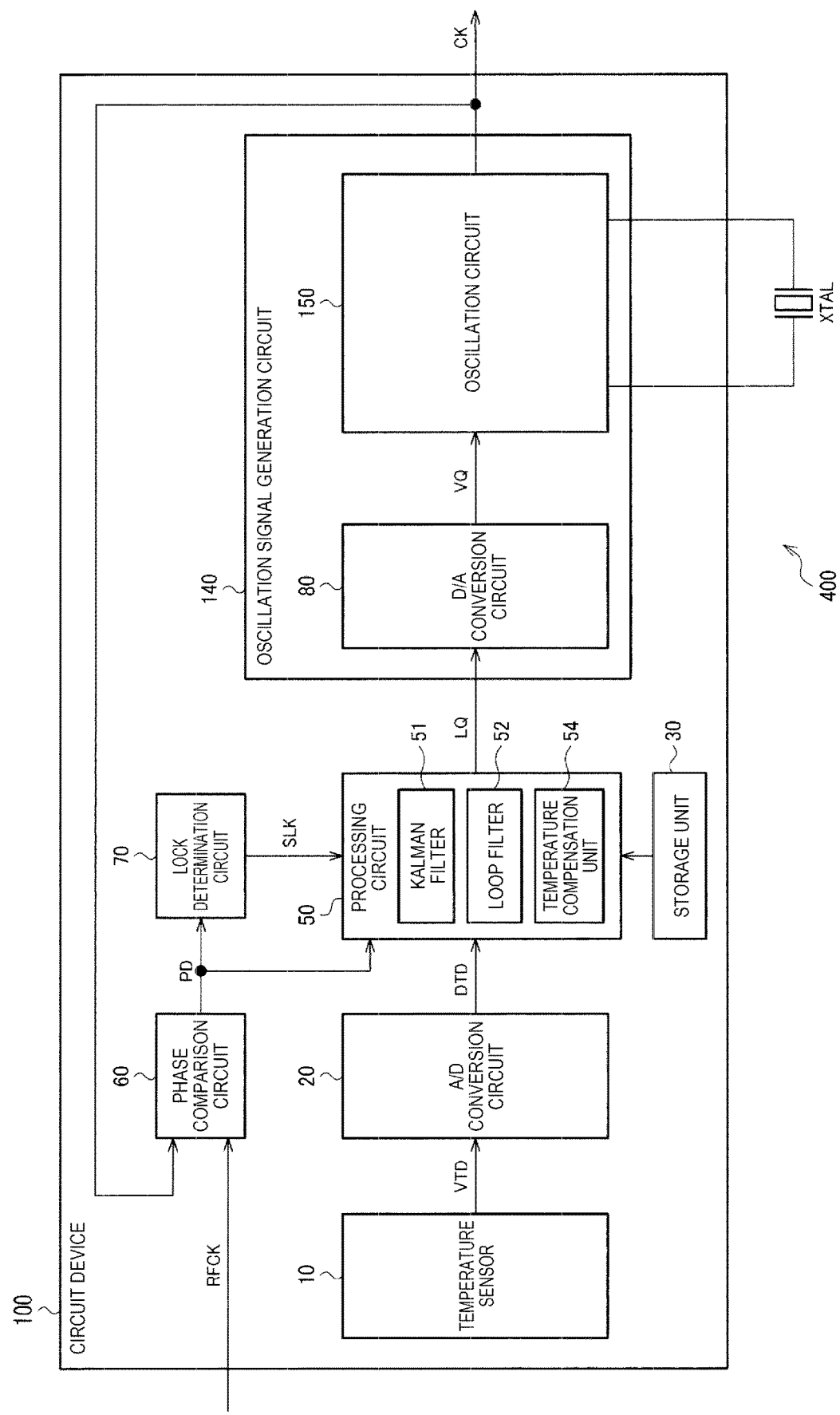
FIG. 13 illustrates a configuration example of an oscillator and a second configuration example of the circuit device.

As illustrated in FIG. 13, the circuit device 100 includes a storage unit 30. The storage unit 30 stores a first initial value which is an initial value of the system noise variance value v2. The storage unit 30 is, for example, a register, a RAM, a nonvolatile memory, or the like. The processing circuit 50 performs first processing of changing the system noise variance value v2 from the first initial value. Specifically, the noise variance value output unit 124 of FIG. 4 performs the first processing.

According to the present embodiment, it is possible to change the cutoff frequency fc of the low pass filter characteristic in the convergence state by changing the system noise variance value v2 from the first initial value. Thereby, it is possible to control followability of the estimated value with respect to the observed value. Specifically, when an operation of the linear Kalman filter 122 starts, the Kalman gain g is increased to increase the cutoff frequency fc, and then, the Kalman gain g is decreased to decrease the cutoff frequency fc. Thereby, it is possible to improve the followability of the estimated value when the operation of the linear Kalman filter 122 starts, and to improve an estimation accuracy after the follow-up.

The storage unit 30 stores a second initial value which is an initial value of the observed noise variance value w2. The processing circuit 50 performs second processing of changing the observed noise variance value w2 from the second initial value. Specifically, the noise variance value output unit 124 of FIG. 4 performs the second processing.

According to the present embodiment, it is possible to change the cutoff frequency fc of the low pass filter characteristic in the convergence state by changing the observed noise variance value w2 from the second initial value. Thereby, it is possible to control followability of the estimated value with respect to the observed value. Specifically, when an operation of the linear Kalman filter 122 starts, the Kalman gain g is increased to increase the cutoff frequency fc, and then, the Kalman gain g is decreased to decrease the cutoff frequency fc. Thereby, it is possible to improve the followability of the estimated value when the operation of the linear Kalman filter 122 starts and to improve the estimation accuracy after the follow-up.

The processing circuit 50 performs at least one of the first processing and the second processing. That is, the processing circuit 50 may perform the first processing without performing the second processing. In this case, the storage unit 30 stores the first initial value. Alternatively, the processing circuit 50 may not perform the first processing by performing the second processing. In this case, the storage unit 30 stores the second initial value. Alternatively, the processing circuit 50 may perform both the first processing and the second processing. In this case, the storage unit 30 stores the first initial value and the second initial value.

Hereinafter, a configuration and an operation of the noise variance value output unit 124 will be described in detail. Hereinafter, an example in which a time change of at least one of v2 and w2 is linearly made will be described, the invention is not limited thereto, and the time change may be nonlinearly made.

As illustrated in FIG. 4, the noise variance value output unit 124 includes selectors 131 and 135, adders 132 and 136, delay elements 133 and 137, and limiters 134 and 138.

A lock determination signal SLK is input to the noise variance value output unit 124. The lock determination signal SLK indicates whether or not the PLL circuit of FIG. 2 in the non-holdover state is in a lock state, and is input from, for example, a lock determination circuit 70 of FIG. 13. Hereinafter, it is assumed that the lock determination signal SLK is in a high level in the lock state and the lock determination signal SLK is in a low level in the unlock state.

The selector 131 selects a coefficient 0 when the lock determination signal SLK is in a low level and selects a coefficient CFA when the lock determination signal SLK is in a high level. The coefficient CFA is stored in, for example, the storage unit 30 of FIG. 13. The adder 132 and the delay element 133 configure a first integrator, and the first integrator integrates output data of the selector 131. The delay element 133 is a latch circuit or a register. When the lock determination signal SLK is in a low level, the first initial value is set in the delay element 133. When the lock determination signal SLK is in a high level, data held by the delay element 133 is updated by processing of the first integrator. The limiter 134 performs first limit processing in which a first limit value is used as an upper limit, for the output data of the first integrator and outputs the processed data as the system noise variance value v2. The first limit value is stored in, for example, the storage unit 30 of FIG. 13.

The selector 135 selects the coefficient 0 when the lock determination signal SLK is in a low level and selects the coefficient CFB when the lock determination signal SLK is in a high level. The coefficient CFB is stored in, for example, the storage unit 30 of FIG. 13. The adder 136 and the delay element 137 configure a second integrator, and the second integrator integrates output data of the selector 135. The delay element 137 is a latch circuit or a register. When the lock determination signal SLK is in a low level, the second initial value is set in the delay element 137. When the lock determination signal SLK is in a high level, data held by the delay element 137 is updated by processing of the second integrator. The limiter 138 performs second limit processing in which the second limit value is used as an upper limit value, for output data of the second integrator and outputs the processed data as the observed noise variance value w2. The second limit value is stored in, for example, the storage unit 30 of FIG. 13.

FIG. 5 is a diagram illustrating the operation of the Kalman filter 51 of FIG. 4. If the PLL circuit of FIG. 2 starts a lock operation for the reference signal CKRF, an oscillation frequency f converges to a target frequency fd. The lock determination signal SLK changes from the low level to the high level at timing TL when the oscillation frequency f approaches the target frequency fd sufficiently.

Since the selectors 131 and 135 select the coefficient 0 while the lock determination signal SLK is in a low level, the first integrator continuously outputs the first initial value, and the second integrator continuously outputs the second initial value. That is, the system noise variance value v2 and the observed noise variance value w2 are not changed. In this case, the Kalman gain g(k) of the linear Kalman filter 122 converges to a constant value. When the Kalman gain g(k) converges to the constant value, the linear Kalman filter 122 operates as a low pass filter having the cutoff frequency fc determined by Equation (7) described above.

Since the selector 131 selects the coefficient CFA while the lock determination signal SLK is in a high level, the output data of the first integrator decreases from the first initial value. Here, CFA<0. The system noise variance value v2 decreases from the first initial value to the first limit value, and thereafter the first limit value is maintained. This processing corresponds to the above-described first processing. In addition, since the selector 135 selects the coefficient CFB, the output data of the second integrator increases from the second initial value. Here, CFB>0. The observed noise variance value w2 increases from the second initial value to the second limit value, and thereafter the second limit value is maintained. This processing corresponds to the above-described second processing.

In the present embodiment, at least one of the first processing and the second processing is performed. In a case only the first processing is performed, it is assumed that CFA<0 and CFB=0. In a case where only the second processing is performed, it is assumed that CFA=0 and CFB>0. In a case where the first processing and the second processing are performed, it is assumed that CFA<0 and CFB>0. By performing at least one of the first processing and the second processing, the Kalman gain g(k) decreases after the timing TLB and gradually approaches a constant value as illustrated in FIG. 5. The cutoff frequency fc when the Kalman gain converges to a constant value is determined by Equation (7) described above. In Equation (7) described above, as the Kalman gain g decreases, the cutoff frequency fc decreases, and thus, the cutoff frequency fc posterior to the timing TLB is lower than the cutoff frequency fc prior to the timing TLB.

FIG. 6 illustrates an example of simulation results when only the first processing is performed. The system noise variance value v2 is a first initial value SNini up to the timing TLB, and decreases linearly to a first limit value SNmin after the timing TLB. A slope at the time of decreasing is determined by the coefficient CFA. The observed noise variance value w2 is not changed from a second initial value KNini.

Before the timing TLB, the Kalman gain g(k) rises and gradually approaches a constant value ga1. After the timing TLB, the Kalman gain g(k) decreases as the system noise variance value v2 decreases and gradually approaches a constant value ga2. When the Kalman gain g(k) converges, the linear Kalman filter 122 operates as a low pass filter having the cutoff frequency fc determined by Equation (7) described above. Since ga2<ga1, the cutoff frequency fc when g=ga2 is lower than the cutoff frequency fc when g=ga1.

FIG. 7 illustrates an example of simulation results when only the second processing is performed. The observed noise variance value w2 is the second initial value KNini up to the timing TLB and increases linearly up to a second limit value KNmax after the timing TLB. A slope at the time of increasing is determined by the coefficient CFB. The system noise variance value v2 is not changed from the first initial value SNini.

Before the timing TLB, the Kalman gain g(k) rises and gradually approaches a constant value gb1. After the timing TLB, the Kalman gain g(k) decreases as the observed noise variance value w2 increases and gradually approaches a constant value gb2. Since gb2<gb1, the cutoff frequency fc when g=gb2 is lower than the cutoff frequency fc when g=gb1, according to Equation (7) described above.

FIG. 8 illustrates an example of simulation results when both the first processing and the second processing are performed. Also in this case, the Kalman gain g(k) rises and gradually approaches a constant value gc1 before the timing TLB, and the Kalman gain g(k) decreases and gradually approaches a constant value gc2 after the timing TLB. Since gc2<gc1, the cutoff frequency fc when g=gc2 is lower than the cutoff frequency fc when g=gc1, according to Equation (7) described above.

In the present embodiment described above, the first processing monotonically decreases the system noise variance value v2 from the first initial value. In addition, the second processing monotonically increases the observed noise variance value w2 from the second initial value.

Thereby, after the PLL circuit starts an operation, that is, after the Kalman filter 51 starts to estimate a truth value, the Kalman gain increases, and thereby, followability of estimation can be improved. In addition, after the PLL circuit enters the lock state, the Kalman gain decreases, and thereby, the estimation accuracy can be improved.

Figure 9:
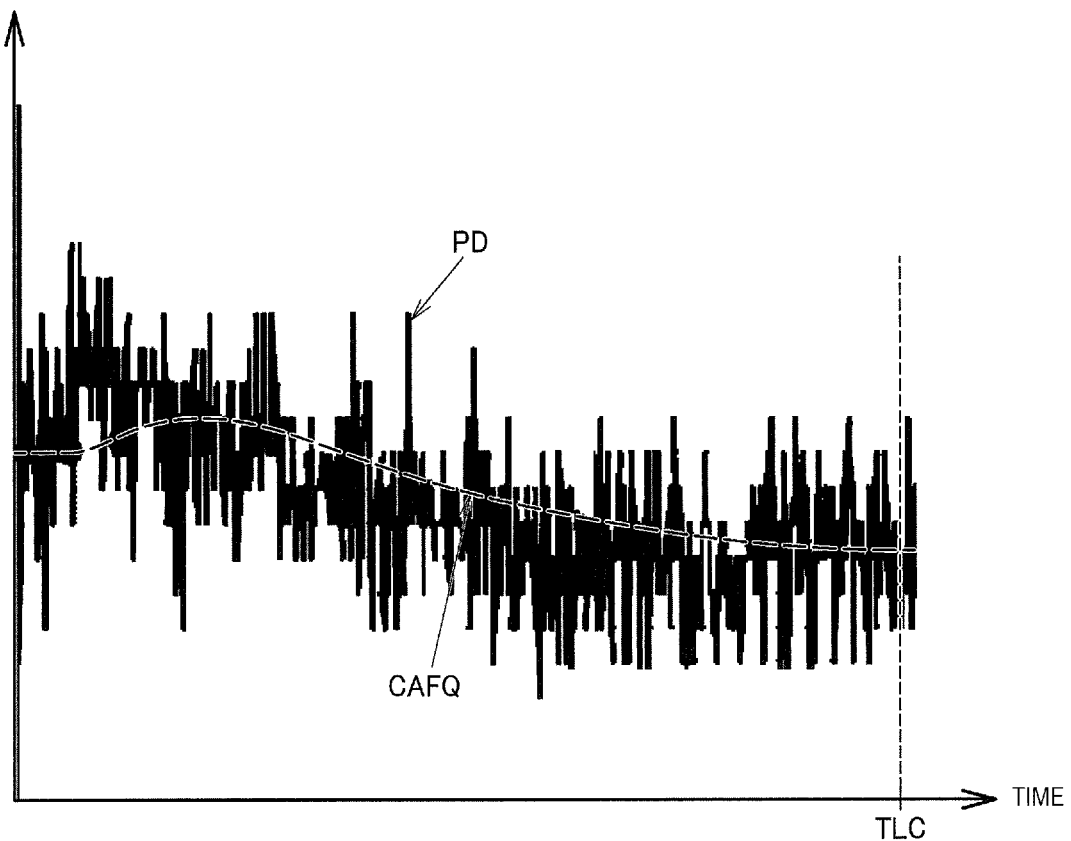
FIG. 9 illustrates an example of simulation results of Kalman filter processing in a case where a system noise variance value and an observed noise variance value are not changed.

FIG. 9 is an example of simulation results of the Kalman filter processing in a case where the system noise variance value v2 and the observed noise variance value w2 are not changed. Although the phase difference data PD output from the phase comparison circuit 60 varies for each comparison operation, the PLL circuit is locked to the reference signal CKRF and an average value of the phase difference data PD converges. The Kalman filter 51 estimates a truth value corresponding to the average value. As illustrated in FIG. 9, the Kalman filter 51 approximately converges to the truth value at time TLC.

Figure 10:
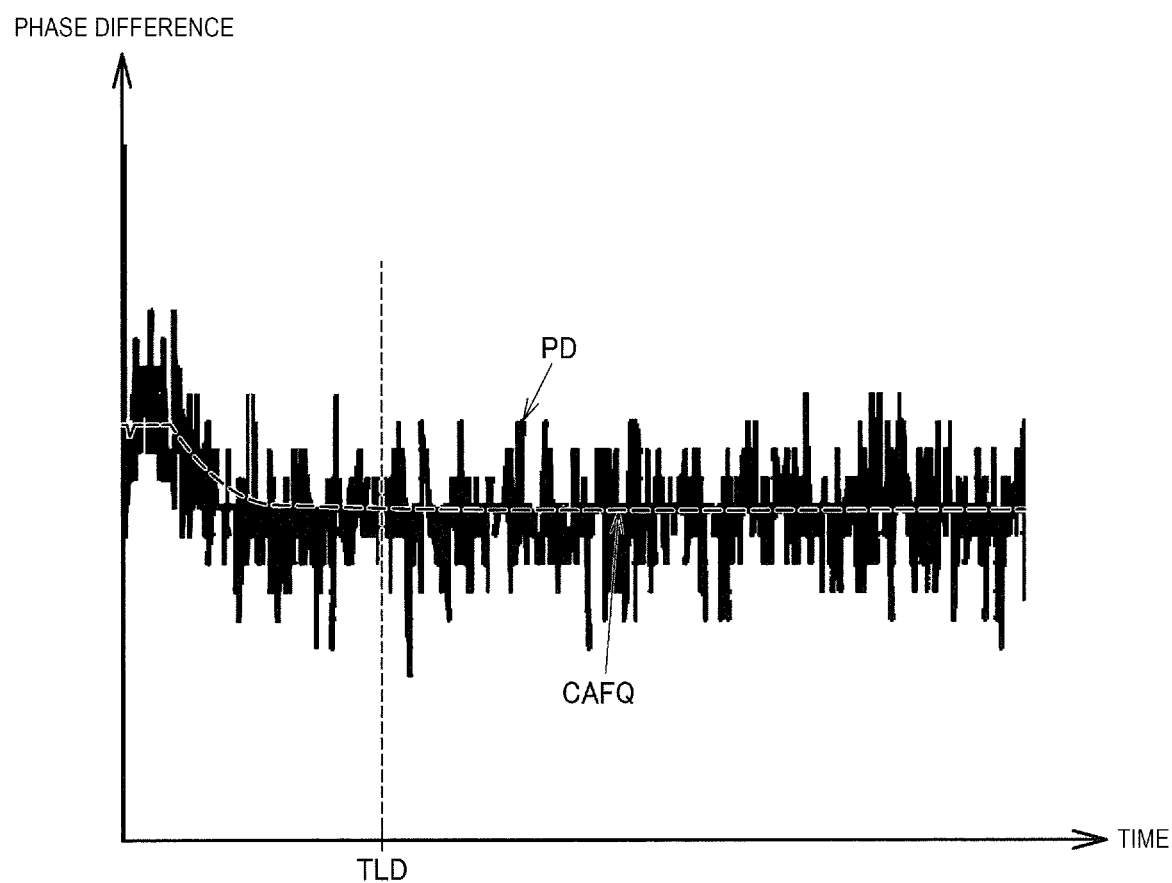
FIG. 10 illustrates an example of simulation results of the Kalman filter processing in a case where the observed noise variance value is changed.

FIG. 10 illustrates an example of simulation results of the Kalman filter processing in a case where the observed noise variance value w2 is changed. The system noise variance value v2 is constant. As illustrated in FIG. 10, the Kalman filter 51 approximately converges to a truth value at time TLD. If FIG. 9 is compared with FIG. 10, TLD<TLC. That is, it is understood that when the Kalman gain is controlled by changing the observed noise variance value w2 the Kalman filter processing converges in a short time rather than in a case where the system noise variance value v2 and the observed noise variance value w2 are not changed.

3. Loop Filter

Figure 11:
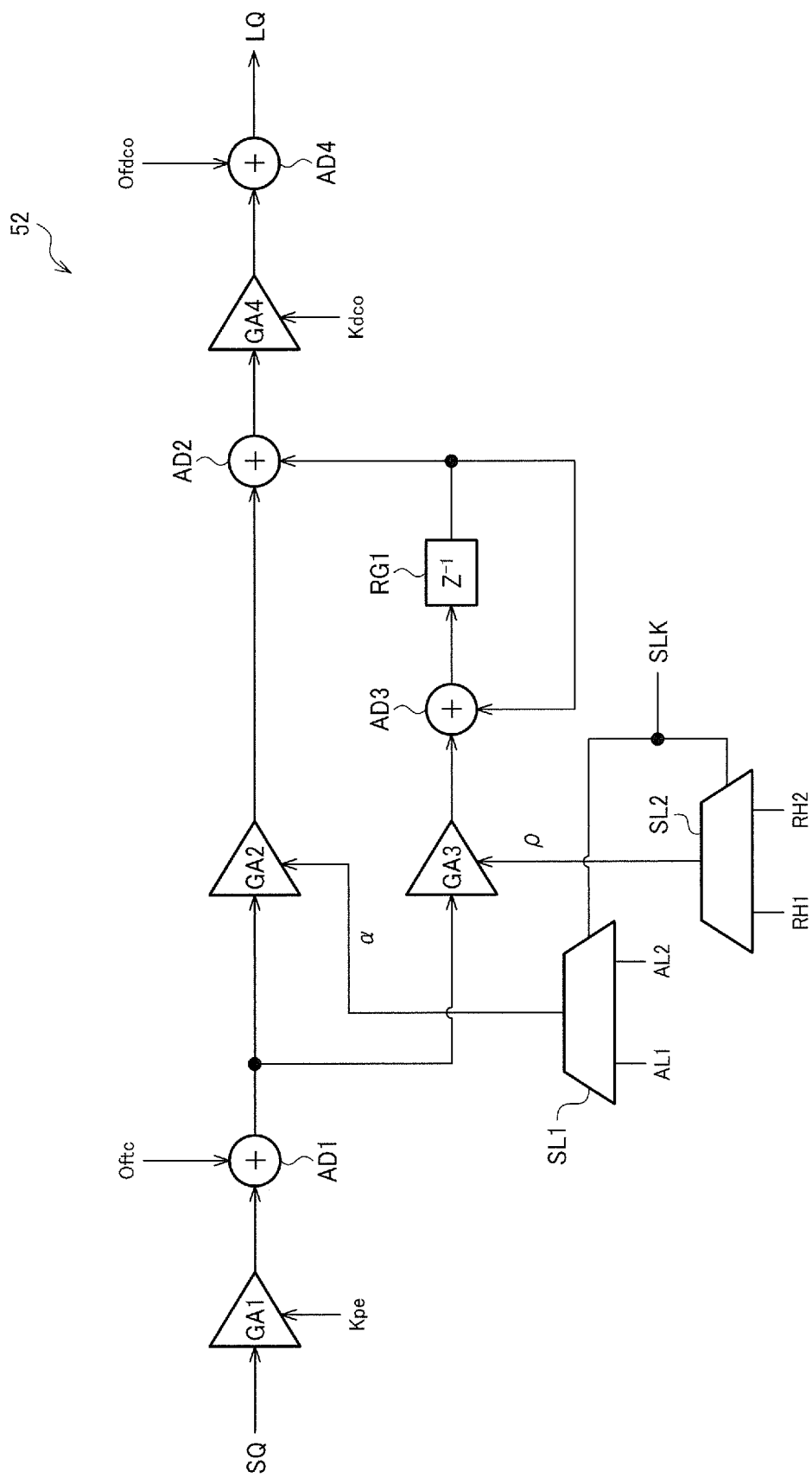
FIG. 11 illustrates a detailed configuration example of a loop filter.

FIG. 11 is a detailed configuration example of the loop filter 52. The loop filter 52 includes multipliers GA1 to GA4, adders AD1 to AD4, a delay element RG1, and selectors SL1 and SL2.

The multiplier GA1 multiplies the output data SQ of the selector 53 by a coefficient Kpe. The adder AD1 adds an offset Oftc to output data of the multiplier GA1. The coefficients Kpe and the offset Oftc are a gain and an offset for an input.

The multiplier GA2 multiplies output data of the adder AD1 by a coefficient α. The selector SL1 selects α=AL1 when the lock determination signal SLK is in a low level and selects α=AL2 when the lock determination signal SLK is in a high level. AL1>AL2>0. The multiplier GA3 multiplies the output data of the adder AD1 by a coefficient ρ. The selector SL2 selects ρ=RH1 when the lock determination signal SLK is in a low level and selects ρ=RH2 when the lock determination signal SLK is in a high level. RH1>RH2>0, RH1<AL1, and RH2<AL2. The adder AD3 and the delay element RG1 configure an integrator, and the integrator integrates output data of the multiplier GA3. The adder AD2 adds output data of the multiplier GA2 to output data of the integrator.

The multiplier GA4 multiplies output data of the adder AD2 by a coefficient Kdco. The adder AD4 adds output data of the multiplier GA4 to an offset Ofdco. The coefficient Kdco and the offset Ofdco are a gain and an offset for an output.

Equation (8) below represents a transfer function of the loop filter 52. Equation (8) below represents the transfer function when Oftc=Ofdco=0 and Kpe=Kdco=1.

$$H_{LF}(z) = \frac{\alpha + (\rho - \alpha)z^{-1}}{1 - z^{-1}} \quad (8)$$

The transfer function of Equation (8) described above has a low pass filter characteristic. In the transfer function of Equation (8) described above, by switching the coefficient α from AL1 to AL2 smaller than AL1 and switching the coefficient ρ from RH1 to RH2 smaller than RH1, a cutoff frequency of the low pass filter characteristic can be decreased.

FIG. 12 is an example of simulation results of the PLL circuit of FIG. 2 to which the loop filter 52 of FIG. 11 is applied. As the PLL circuit performs a lock operation for the reference signal CKRF, the phase difference data PD output from the phase comparison circuit 60 gradually converges to zero. In a case where it is determined that the phase difference data PD converges to zero, the lock determination signal SLK changes from a low level to a high level. In FIG. 12, the lock determination signal SLK changes from the low level to the high level, for example, at time TLE.

Since the cutoff frequency of the loop filter 52 is higher before the time TLE than after the time TLE, convergence of the PLL circuit is improved before the time TLE. Thereby, it is possible to reduce the time until the PLL circuit is locked. Meanwhile, since the cutoff frequency of the loop filter 52 decreases after the time TLE when the PLL circuit is in a lock state, noise characteristics of the oscillation signal can be improved. As illustrated in FIG. 12, a variation of an oscillation frequency deviation after the time TLE is smaller than a variation of a frequency deviation before the time TLE, and characteristics of the oscillation signal are improved. For example, jitter characteristics of the oscillation signal can be improved. Here, the oscillation frequency deviation is a deviation between an oscillation frequency and a target frequency.

In the above-described embodiment, when it is determined that the oscillation signal is locked to the reference signal CKRF, the processing circuit 50 changes the cutoff frequency for the loop filter processing from the first frequency to the second frequency lower than the first frequency. In FIG. 11, the first frequency is a cutoff frequency when α=AL1 and ρ=RH1, and the second frequency is a cutoff frequency when α=AL2 and ρ=RH2.

According to the present embodiment, since the cutoff frequency of the loop filter 52 is set to the first frequency higher than the second frequency in the unlock state, convergence of the PLL circuit can be improved. In addition, since the cutoff frequency of the loop filter 52 is set to the second frequency lower than the first frequency in the lock state, noise characteristics of the PLL circuit can be improved.

In the present embodiment, when it is determined that the oscillation signal is locked to the reference signal CKRF, the processing circuit 50 changes the cutoff frequency of the loop filter 52 from the first frequency to the second frequency and performs at least one of the first processing of changing the system noise variance value v2 of the Kalman filter processing from the first initial value and the second processing of changing the observed noise variance value w2 from the second initial value. The first processing and the second processing are the same as described with reference to FIG. 4 and the like.

According to the present embodiment, by performing at least one of the first processing and the second processing, convergence time of the Kalman filter processing can be reduced. At this time, by changing the cutoff frequency of the loop filter 52, convergence of the phase difference data PD, which is an observed value of the Kalman filter processing, is improved. Thereby, it is possible to further reduce the convergence time of the Kalman filter processing.

4. Oscillator, Electronic Apparatus, and Vehicle

FIG. 13 illustrates a configuration example of an oscillator 400 and a second configuration example of the circuit device 100. The oscillator 400 includes a resonator XTAL and the circuit device 100. The circuit device 100 realizes a digital oscillator such as a temperature compensated crys(X)tal oscillator (TCXO) or an oven controlled crys(X)tal oscillator (OCXO). The circuit device 100 is, for example, an integrated circuit device. For example, by housing the circuit device 100 and the resonator XTAL in a package, the digital oscillator is realized.

The circuit device 100 includes a temperature sensor 10, an A/D conversion circuit 20, a processing circuit 50, an oscillation signal generation circuit 140, a phase comparison circuit 60, and a lock determination circuit 70. The phase comparison circuit 60 may be included in the processing circuit 50, or the lock determination circuit 70 may be included in the processing circuit 50. The temperature sensor may be provided outside the circuit device 100. In this case, a temperature detection voltage is input to the circuit device 100 from a temperature sensor provided outside.

The temperature sensor 10 outputs a temperature dependent voltage that changes depending on a temperature of an environment (for example, a circuit device or a resonator) as a temperature detection voltage VTD. The temperature of the environment is a temperature of a substrate of the circuit device 100 or a temperature of the resonator XTAL. The temperature sensor 10 generates the temperature dependent voltage using a circuit element having a temperature dependency and outputs the temperature dependent voltage with reference to a voltage which is not dependent on a temperature. For example, the temperature dependent voltage is output based on a forward voltage of a PN junction. The voltage which is not dependent on the temperature is, for example, a bandgap reference voltage.

The A/D conversion circuit 20 performs an A/D conversion of the temperature detection voltage VTD from the temperature sensor 10, and outputs a result thereof as temperature detection data DTD. For example, a successive approximation type, a flash type, a pipeline type, a double integral type or the like can be adopted as an A/D conversion method.

The processing circuit 50 performs various types of digital signal processing. The processing circuit 50 includes a Kalman filter 51, a loop filter 52, and a temperature compensation unit 54. The Kalman filter 51 performs Kalman filter processing by using phase difference data PD from a phase comparison circuit 60 as an observed value. In a case where a lock determination signal SLK indicates an unlock state, the loop filter 52 performs loop filter processing for the phase difference data PD from the phase comparison circuit 60. In a case where the lock determination signal SLK indicates a lock state, the loop filter 52 performs loop filter processing for the estimated phase difference data held in the Kalman filter 51. Based on the temperature detection data DTD, the temperature compensation unit 54 performs temperature compensation processing to compensate for the temperature characteristics of an oscillation frequency of the resonator XTAL. Specifically, the temperature compensation unit 54 obtains temperature compensation data by inserting the temperature detection data DTD into an approximate function that reduces a variation in the oscillation frequency due to a temperature change. The temperature compensation unit 54 corrects output data of the loop filter 52 based on the temperature compensation data and outputs the corrected data as frequency control data LQ. The processing circuit 50 is a logic circuit. For example, the processing circuit 50 is a digital signal processor (DSP) or an ASIC. Alternatively, the processing circuit 50 may be realized by a processor and a program operating in the processor. The processor is a CPU, an MPU, or the like.

The oscillation signal generation circuit 140 includes a D/A conversion circuit 80 and an oscillation circuit 150. As described with reference to FIG. 2, a configuration of the oscillation signal generation circuit 140 is not limited to this. The D/A conversion circuit 80 performs a D/A conversion of the frequency control data LQ and outputs a control voltage VQ corresponding to the frequency control data LQ. The oscillation circuit 150 oscillates the resonator XTAL at an oscillation frequency corresponding to the control voltage VQ and outputs the clock signal CK based on the oscillation signal.

The storage unit 30 stores operation setting information of the circuit device 100, various parameters used by the processing circuit 50 or the like. The storage unit 30 stores, for example, the coefficients CFA and CFB, the first initial value, the second initial value, the first limit value, and the second limit value in FIG. 4. The storage unit 30 stores the coefficients AL1, AL2, RH1, and RH2 of FIG. 11. The storage unit 30 stores coefficients of an approximate function used for temperature compensation processing. The storage unit 30 is, for example, a nonvolatile memory. Alternatively, the storage unit 30 may be a register, a RAM or the like. The circuit device 100 may include an interface circuit (not illustrated), and an external processing device may set a parameter such as the coefficient CFA in the storage unit 30 through the interface circuit.

The phase comparison circuit 60 compares phases of the reference signal CKRF and the clock signal CK and outputs a comparison result as the phase difference data PD to the processing circuit 50. The phase comparison circuit 60 is, for example, a counter or a time digital conversion circuit.

The lock determination circuit 70 determines whether or not the PLL circuit is locked based on the phase difference data PD and outputs a determination result thereof to the processing circuit 50 as a lock determination signal SLK. The PLL circuit is configured with a phase comparison circuit 60, a loop filter 52, and an oscillation signal generation circuit 140. The lock determination circuit 70 integrates the phase difference data PD, for example, from a predetermined time to the present and determines that the lock state is established in a case where an integrated value is smaller than or equal to a predetermined value.

Figure 14:
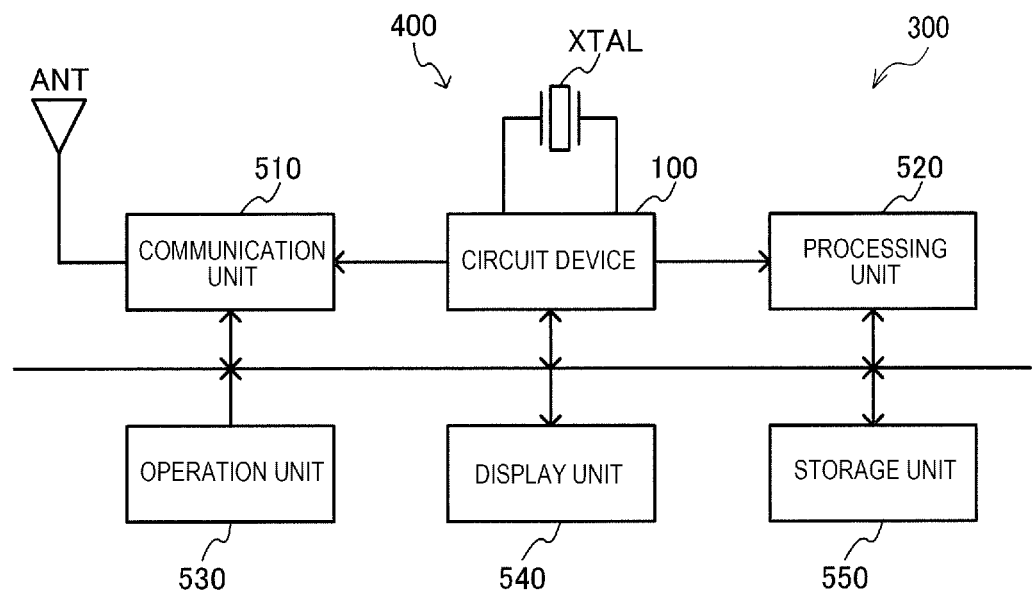
FIG. 14 illustrates a configuration example of an electronic apparatus.

FIG. 14 illustrates a configuration example of an electronic apparatus 300 including the circuit device 100. The electronic apparatus 300 includes an oscillator 400 having the circuit device 100 and the resonator XTAL, and a processing unit 520. The electronic apparatus can include a communication unit 510, an operation unit 530, a display unit 540, a storage unit 550, and an antenna ANT.

Various apparatuses can be used as the electronic apparatus 300. For example, a wearable apparatus such as a GPS built-in timepiece, a biological information measurement apparatus or a head-mounted display device can be used. The biological information measurement apparatus is a pulse wave meter, a pedometer or the like. Alternatively, a portable information terminal such as a smartphone, a mobile phone, a portable game device, a notebook PC or a tablet PC can be used. Alternatively, a content providing terminal that distributes content, a video device such as a digital camera or a video camera, a network-related apparatus such as a base station or a router, or the like can be used. Alternatively, a measurement apparatus that measures a physical quantity such as a distance, time, a flow rate or the amount of flow, an in-vehicle apparatus, a robot, or the like. The in-vehicle apparatus is an apparatus for an automatic drive or the like.

The communication unit 510 receives data from the outside via the antenna ANT and performs processing of transmitting data to the outside. The communication unit 510 is, for example, a communication circuit. The processing unit 520 performs control processing of the electronic apparatus, various types of digital processing of data transmitted and received through the communication unit 510, and the like. A function of the processing unit 520 can be realized by a processor such as a microcontroller. The operation unit 530 is for the user to perform an input operation, and can be realized by an operation button, a touch panel display, or the like. The operation unit 530 is, for example, an operation device. The display unit 540 displays various types of information and can be realized by a display such as liquid crystal or organic EL. The storage unit 550 stores data, and a function thereof can be realized by a semiconductor memory such as a RAM or a ROM, a hard disk drive, or the like.

Figure 15:
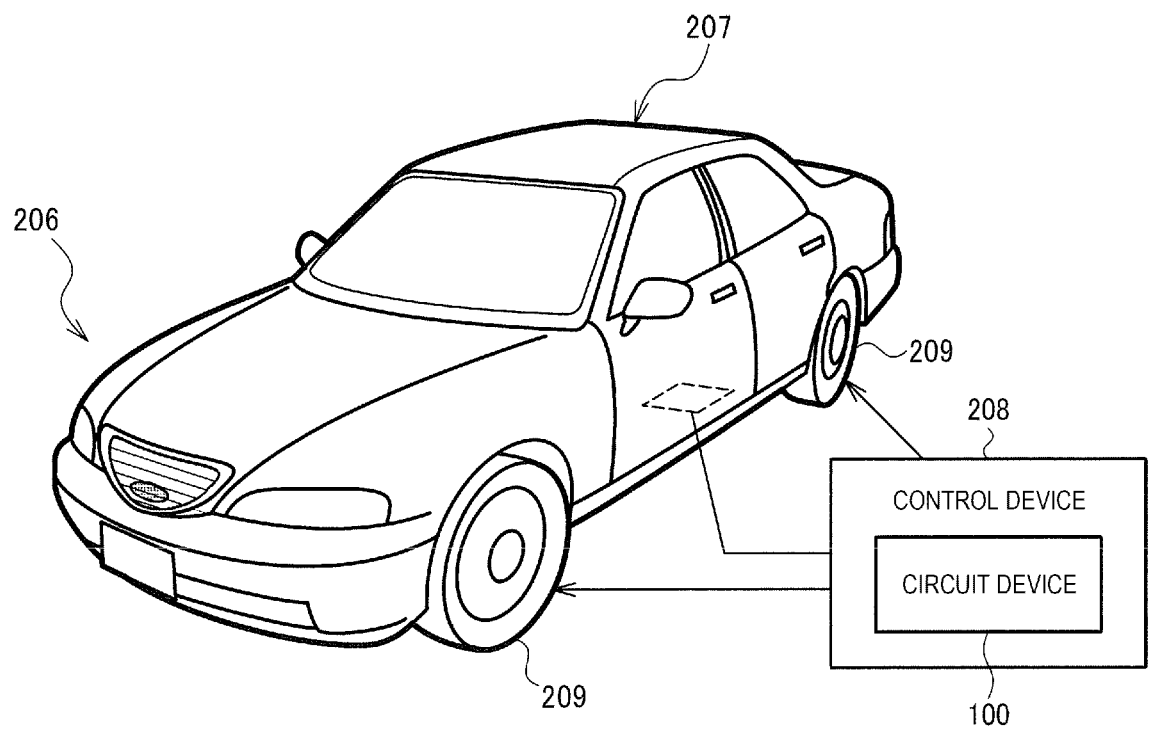
FIG. 15 illustrates an example of a vehicle.

FIG. 15 illustrates an example of a vehicle including the circuit device 100. The circuit device 100 can be incorporated into various moving objects such as a car, an airplane, a motorcycle, a bicycle, a robot, a ship, and the like. The vehicle is an apparatus or device that includes a drive mechanism such as an engine and a motor, a steering mechanism such as a steering wheel and a rudder, and various types of electronic apparatuses and moves on the ground, the sky, or the sea. FIG. 15 schematically illustrates an automobile 206 as a specific example of the vehicle. An oscillator (not illustrated) including the circuit device 100 is incorporated into the automobile 206. A control device 208 performs various types of control processing based on a clock signal generated by the oscillator. For example, the control device 208 controls hardness of a suspension according to a posture of a vehicle body 207 and controls brakes of separate wheels 209. The circuit device 100 or a device into which the oscillator is incorporated is not limited to the control device 208 and can be incorporated into various apparatuses provided in a vehicle such as the automobile 206 or a robot.

Although the present embodiments are described in detail as above, it will be easily understood by those skilled in the art that various modifications can be made which do not deviate practically from the novel matters and effects of the invention. Accordingly, all the modifications are included in the scope of the invention. For example, in the specification or the drawings, a term described together with a different term which is broader or equivalent at least once can be replaced with a different term at any point in the specification or the drawings. In addition, all combinations of the present embodiments and modifications are included in the scope of the invention. In addition, configurations and operations of the circuit device, the oscillator, the electronic apparatus, and the vehicle are not limited to those described in the present embodiments, and various modifications can be made.

The entire disclosure of Japanese Patent Application No. 2018-064906, filed Mar. 29, 2018 is expressly incorporated by reference herein.

What is claimed is:

1. A circuit device comprising:
a processing circuit that performs Kalman filter processing for a result of phase comparison between an input signal based on an oscillation signal and a reference signal, and performs loop filter processing for the result of phase comparison; and
an oscillation signal generation circuit that generates the oscillation signal of an oscillation frequency set by frequency control data which is output data of the loop filter processing by using the frequency control data and a resonator,
wherein the processing circuit estimates a truth value for an observed value of the result of phase comparison by using the Kalman filter processing, and
wherein, in response to a determination that the oscillation signal is locked to the reference signal, the processing circuit changes a cutoff frequency for the loop filter processing from a first frequency to a second frequency lower than the first frequency.

2. The circuit device according to claim 1,
wherein the processing circuit sets a system noise variance value and an observed noise variance value of the Kalman filter processing, and performs the Kalman filter processing based on the set system noise variance value and the set observed noise variance value.

3. The circuit device according to claim 2, further comprising:
a storage unit that stores a first initial value which is an initial value of the system noise variance value,
wherein the processing circuit performs first processing of changing the system noise variance value from the first initial value.

4. The circuit device according to claim 3,
wherein the first processing is processing of monotonically decreasing the system noise variance value from the first initial value.

5. The circuit device according to claim 2, further comprising:
a storage unit that stores a second initial value which is an initial value of the observed noise variance value,
wherein the processing circuit performs second processing of changing the observed noise variance value from the second initial value.

6. The circuit device according to claim 5,
wherein the second processing is processing of monotonically increasing the observed noise variance value from the second initial value.

7. The circuit device according to claim 2, further comprising:
a storage unit that stores a first initial value which is an initial value of the system noise variance value,
wherein, when it is determined that the oscillation signal is locked to the reference signal, the processing circuit changes a cutoff frequency for the loop filter processing from a first frequency to a second frequency lower than the first frequency and performs first processing of changing the system noise variance value from the first initial value.

8. The circuit device according to claim 7,
wherein the first processing is processing of monotonically increasing the system noise variance value from the first initial value.

9. The circuit device according to claim 2, further comprising:
a storage unit that stores a second initial value which is an initial value of the observed noise variance value,
wherein, when it is determined that the oscillation signal is locked to the reference signal, the processing circuit changes a cutoff frequency for the loop filter processing from a first frequency to a second frequency lower than the first frequency and performs second processing of changing the observed noise variance value from the second initial value.

10. The circuit device according to claim 9,
wherein the second processing is processing of monotonically decreasing the observed noise variance value from the second initial value.

11. The circuit device according to claim 1,
wherein, in a case where a holdover due to disappearance or abnormality of the reference signal is detected, the processing circuit holds the truth value at timing corresponding to detection timing of the holdover and generates the frequency control data which is subjected to aging correction by performing the loop filter processing based on the truth value.

12. The circuit device according to claim 2,
wherein, in a convergence state of the Kalman filter processing, the processing circuit performs low pass filter processing with a cutoff frequency that is set by the system noise variance value and the observed noise variance value.

13. An oscillator comprising:
the circuit device according to claim 1; and
the resonator.

14. An electronic apparatus comprising:
the circuit device according to claim 1.

15. A vehicle comprising:
the circuit device according to claim 1.

* * * * *